United States Patent
Liu et al.

(10) Patent No.: US 12,354,948 B2
(45) Date of Patent: Jul. 8, 2025

(54) INTEGRATED DEVICE AND INTEGRATED PASSIVE DEVICE COMPRISING MAGNETIC MATERIAL

(71) Applicant: QUALCOMM Incorporated, San Diego, CA (US)

(72) Inventors: Kai Liu, Phoenix, AZ (US); Roy Chiu, Taichung (TW); Nosun Park, San Diego, CA (US); Je-Hsiung Lan, San Diego, CA (US); Jonghae Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 497 days.

(21) Appl. No.: 17/855,492

(22) Filed: Jun. 30, 2022

(65) Prior Publication Data

US 2024/0006308 A1    Jan. 4, 2024

(51) Int. Cl.
*H01L 23/522* (2006.01)
*H01F 17/00* (2006.01)
*H01L 23/498* (2006.01)
*H10D 1/20* (2025.01)

(52) U.S. Cl.
CPC ..... *H01L 23/5227* (2013.01); *H01F 17/0013* (2013.01); *H01L 23/49827* (2013.01); *H01L 23/5226* (2013.01); *H10D 1/20* (2025.01); *H01F 2017/002* (2013.01); *H01F 2017/0066* (2013.01)

(58) Field of Classification Search
CPC .......... H01L 23/5227; H01L 23/49827; H01L 23/5226; H01L 28/10; H01F 17/0013; H01F 2017/002; H01F 2017/0066; H10D 1/20
USPC ....................................................... 257/531
See application file for complete search history.

(56) References Cited

U.S. PATENT DOCUMENTS

| | | | |
|---|---|---|---|
| 5,793,272 A | 8/1998 | Burghartz et al. | |
| 9,247,647 B1 | 1/2016 | Yoon et al. | |
| 2019/0221345 A1 | 7/2019 | Vadlamani et al. | |
| 2020/0066634 A1 | 2/2020 | Do et al. | |
| 2021/0043367 A1 | 2/2021 | Yoshioka et al. | |
| 2021/0104475 A1* | 4/2021 | Radhakrishnan | ....... H01L 24/16 |
| 2022/0085143 A1 | 3/2022 | Choi et al. | |

OTHER PUBLICATIONS

International Search Report and Written Opinion—PCT/US2023/069181—ISA/EPO—Oct. 19, 2023.

* cited by examiner

*Primary Examiner* — Tu-Tu V Ho
(74) *Attorney, Agent, or Firm* — Loza & Loza, LLP

(57) ABSTRACT

A device comprising a die substrate, a plurality of interconnects located over the die substrate, wherein the plurality of interconnects are configured to operate as an inductor, at least one magnetic layer that surrounds at least part of the plurality of interconnects; and at least one dielectric layer that surrounds the at least one magnetic layer.

10 Claims, 25 Drawing Sheets

PROFILE CROSS SECTIONAL VIEW

PROFILE CROSS SECTIONAL VIEW

PROFILE CROSS SECTIONAL VIEW

PLAN VIEW

PROFILE CROSS SECTIONAL VIEW

FIG. 7 PROFILE CROSS SECTIONAL VIEW

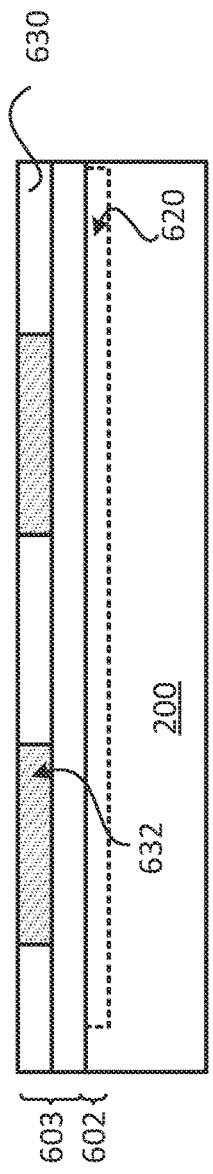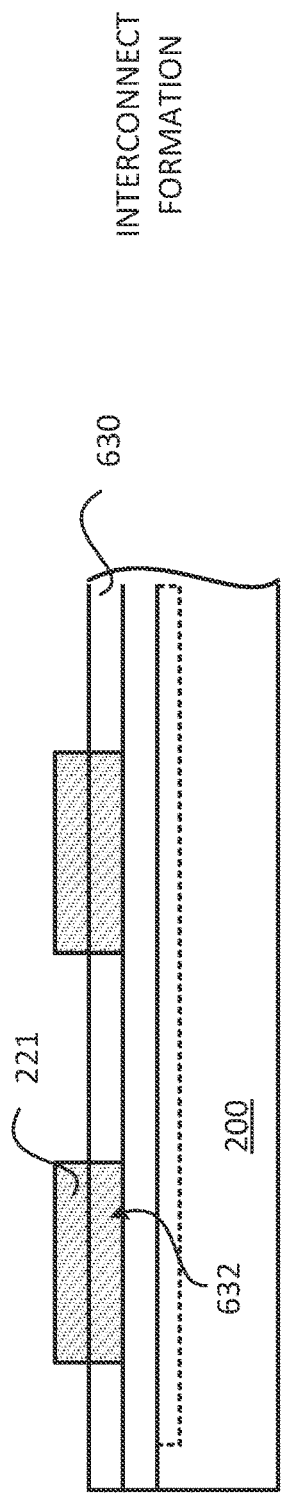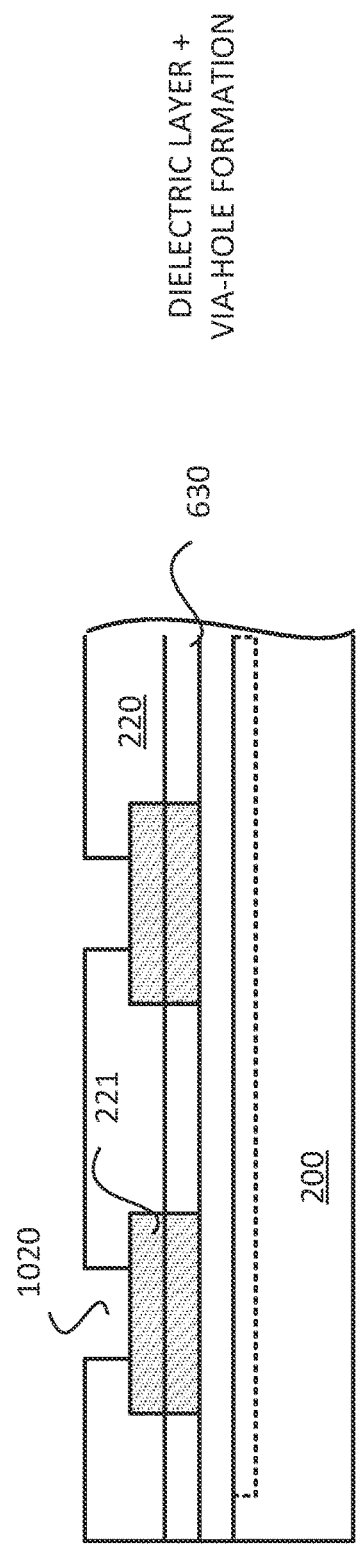
FIG. 12A

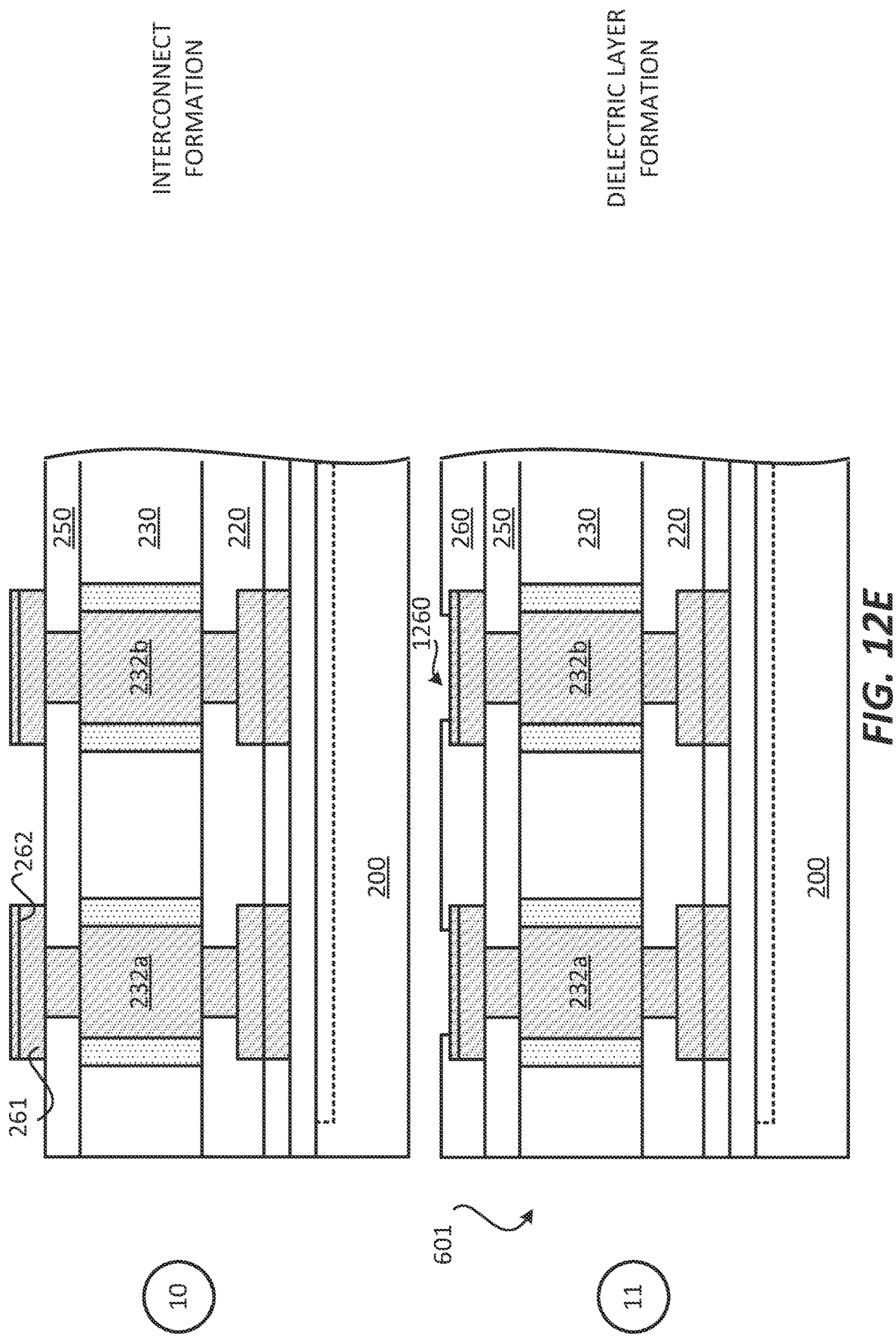

1600

```
┌─────────────────────────────────────────────┐
│ PROVIDE SUBSTRATE COMPRISING AT LEAST ONE   │
│ DIELECTRIC LAYER AND A PLURALITY OF         │─ 1605
│ INTERCONNECTS                               │
└─────────────────────────────────────────────┘
                      │
                      ▼
┌─────────────────────────────────────────────┐
│ COUPLE INTEGRATED DEVICE(S) AND/OR INTEGRATED│
│ PASSIVE DEVICE(S) TO A FIRST SURFACE OF     │
│ THE SUBSTRATE, WHERE AN INTEGRATED DEVICE AND/│─ 1610
│ OR AN INTEGRATED PASSIVE DEVICE INCLUDES A  │
│ MAGNETIC LAYER                              │
└─────────────────────────────────────────────┘
                      │
                      ▼
┌─────────────────────────────────────────────┐
│ COUPLE SOLDER INTERCONNECTS TO THE SUBSTRATE │─ 1615
└─────────────────────────────────────────────┘
```

*FIG. 16*

INTEGRATED DEVICE AND INTEGRATED PASSIVE DEVICE COMPRISING MAGNETIC MATERIAL

FIELD

Various features relate to packages, integrated devices and/or integrated passive devices.

BACKGROUND

Packages can include a substrate, an integrated device and integrated passive device. The substrate may include a plurality of interconnects. The integrated device and/or the integrated passive device may be coupled to interconnects of the substrate. There is an ongoing need to provide smaller packages with improved performances.

SUMMARY

Various features relate to packages, integrated devices and/or integrated passive devices.

One example provides a device comprising a die substrate, a plurality of interconnects located over the die substrate, wherein the plurality of interconnects are configured to operate as an inductor, at least one magnetic layer that surrounds at least part of the plurality of interconnects and at least one dielectric layer that surrounds the at least one magnetic layer.

Another example provides a device comprising a die substrate, a plurality of interconnects located over the die substrate, wherein the plurality of interconnects are configured to operate as an inductor, at least one dielectric layer that surrounds at least part of the plurality of interconnects and at least one magnetic layer that surrounds the at least one dielectric layer.

Another example provides a method that provides a die substrate. The method forms a plurality of interconnects located over the die substrate, where the plurality of interconnects are configured to operate as an inductor. The method forms at least one magnetic layer that surrounds at least part of the plurality of interconnects. The method forms at least one dielectric layer that surrounds the at least one magnetic layer.

Another example provides a method that provides a die substrate. The method forms a plurality of interconnects located over the die substrate, where the plurality of interconnects are configured to operate as an inductor. The method forms at least one dielectric layer that surrounds and touches at least part of the plurality of interconnects. The method forms at least one magnetic layer that surrounds and touches the at least one dielectric layer.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 12A-12E illustrate an exemplary sequence for fabricating an integrated device that includes a magnetic material that surrounds interconnects.

FIG. 16 illustrates an exemplary flow diagram of method for fabricating a package that includes a substrate, an integrated device and an integrated passive device.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device that includes a die substrate, a plurality of interconnects located over the die substrate, wherein the plurality of interconnects are configured to operate as an inductor, at least one magnetic layer that surrounds at least part of the plurality of interconnects and at least one dielectric layer that surrounds the at least one magnetic layer. In some implementations, a device includes a die substrate, a plurality of interconnects located over the die substrate, wherein the plurality of interconnects are configured to operate as an inductor, at least one dielectric layer that surrounds at least part of the plurality of interconnects and at least one magnetic layer that surrounds the at least one dielectric layer. The at least one magnetic layer includes an insulating layer, a dielectric layer and/or a non-electrical conducting material. The at least one magnetic layer has a permeability value (e.g., relative permeability value) that is greater than 1. The magnetic layer is configured to help improve (e.g., increase) the quality factor (Q) and/or the inductance of the inductor. As will be further described below, by helping to improve the quality factor and/or the inductance of the inductor, an inductor with a smaller form factor (e.g., size) may be formed while still having a quality factor and/or an inductance that is equal or better than that of a larger inductor.

Exemplary Integrated Device Comprising Magnetic Material

Figure 1:
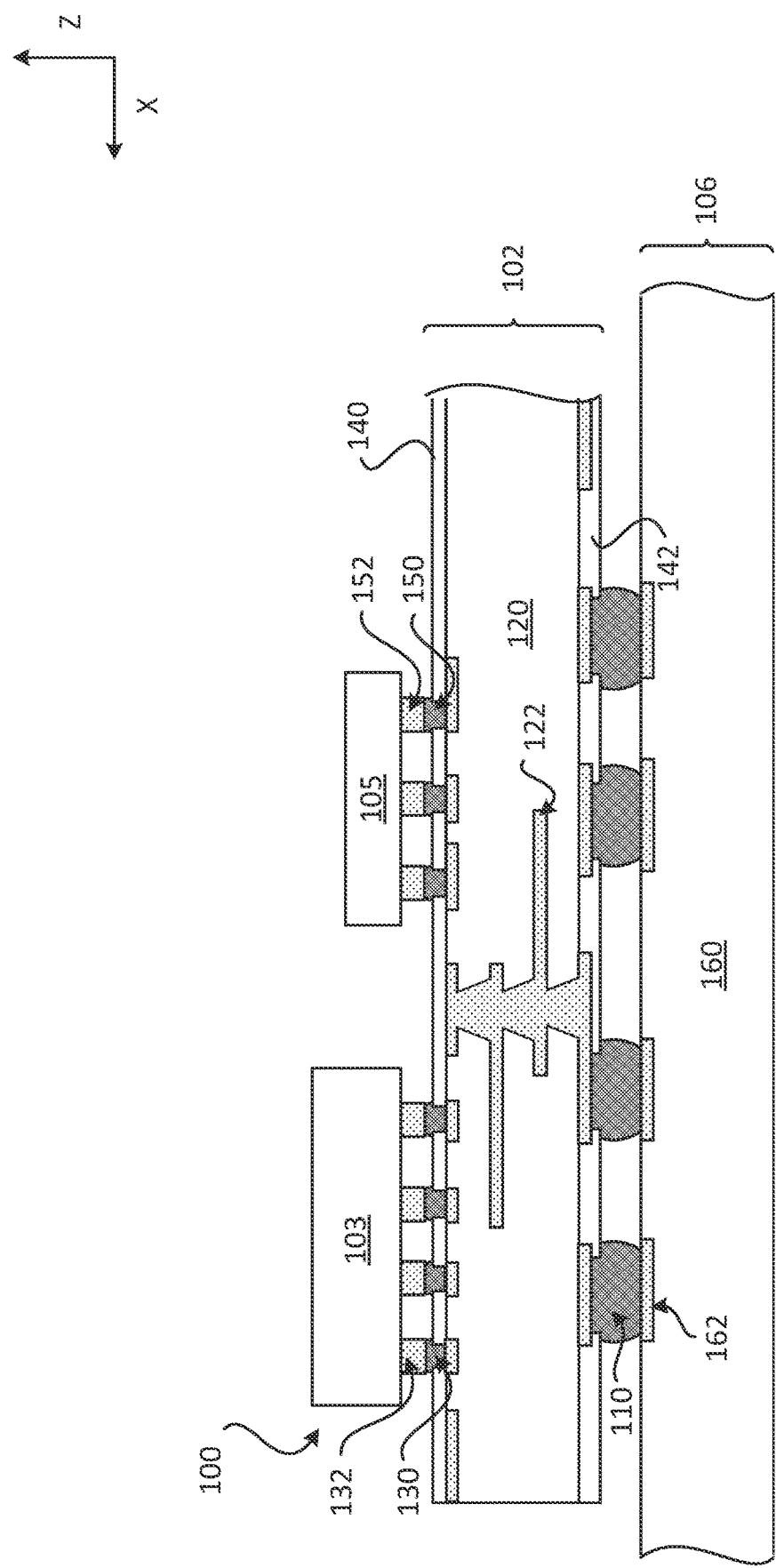
FIG. 1 illustrates an exemplary profile view of a package that includes a substrate, an integrated device and an integrated passive device.

FIG. 1 illustrates a profile view of a package 100 that includes a substrate 102, an integrated device 103 and an integrated passive device 105 (IPD). The package 100 is coupled to a board 106 through a plurality of solder interconnects 110. The board 106 includes at least one board dielectric layer 160 and a plurality of board interconnects 162. The board 106 may include a printed circuit board (PCB).

The substrate 102 includes at least one dielectric layer 120 (e.g., substrate dielectric layer), a plurality of interconnects 122 (e.g., substrate interconnects), a solder resist layer 140 and a solder resist layer 142. The integrated device 103 may be coupled to the substrate 102 through a plurality of solder interconnects 130. The integrated device 103 may be coupled to the substrate 102 through a plurality of pillar interconnects 132 and the plurality of solder interconnects 130. The integrated passive device 105 may be coupled to the substrate 102 through a plurality of solder interconnects 150. The integrated passive device 105 may be coupled to the substrate 102 through a plurality of pillar interconnects 152 and the plurality of solder interconnects 150. A substrate may have a different number of metal layers. Different implementations may use different substrates. The substrate may include an embedded trace substrate (ETS). The at least one dielectric layer 120 may include prepreg.

The package (e.g., 100) may be implemented in a radio frequency (RF) package. The RF package may be a radio frequency front end (RFFE) package. A package (e.g., 100) may be configured to provide Wireless Fidelity (WiFi) communication and/or cellular communication (e.g., 2G, 3G, 4G, 5G). The package (e.g., 100) may be configured to support Global System for Mobile (GSM) Communications, Universal Mobile Telecommunications System (UMTS), and/or Long-Term Evolution (LTE). The package (e.g., 100) may be configured to transmit and receive signals having different frequencies and/or communication protocols.

As will be further described below, the integrated device 103 and/or the integrated passive device 105 may include at least one magnetic layer. The at least one magnetic layer is configured to improve the inductance and/or quality factor of an inductor that is located in and/or surrounded by a magnetic layer. With improved inductor performance, smaller and more compact inductors may be formed in the integrated device 103 and/or the integrated passive device 105. The magnetic layer and/or dielectric layer may be configured to provide coaxial interconnects.

Figure 2:
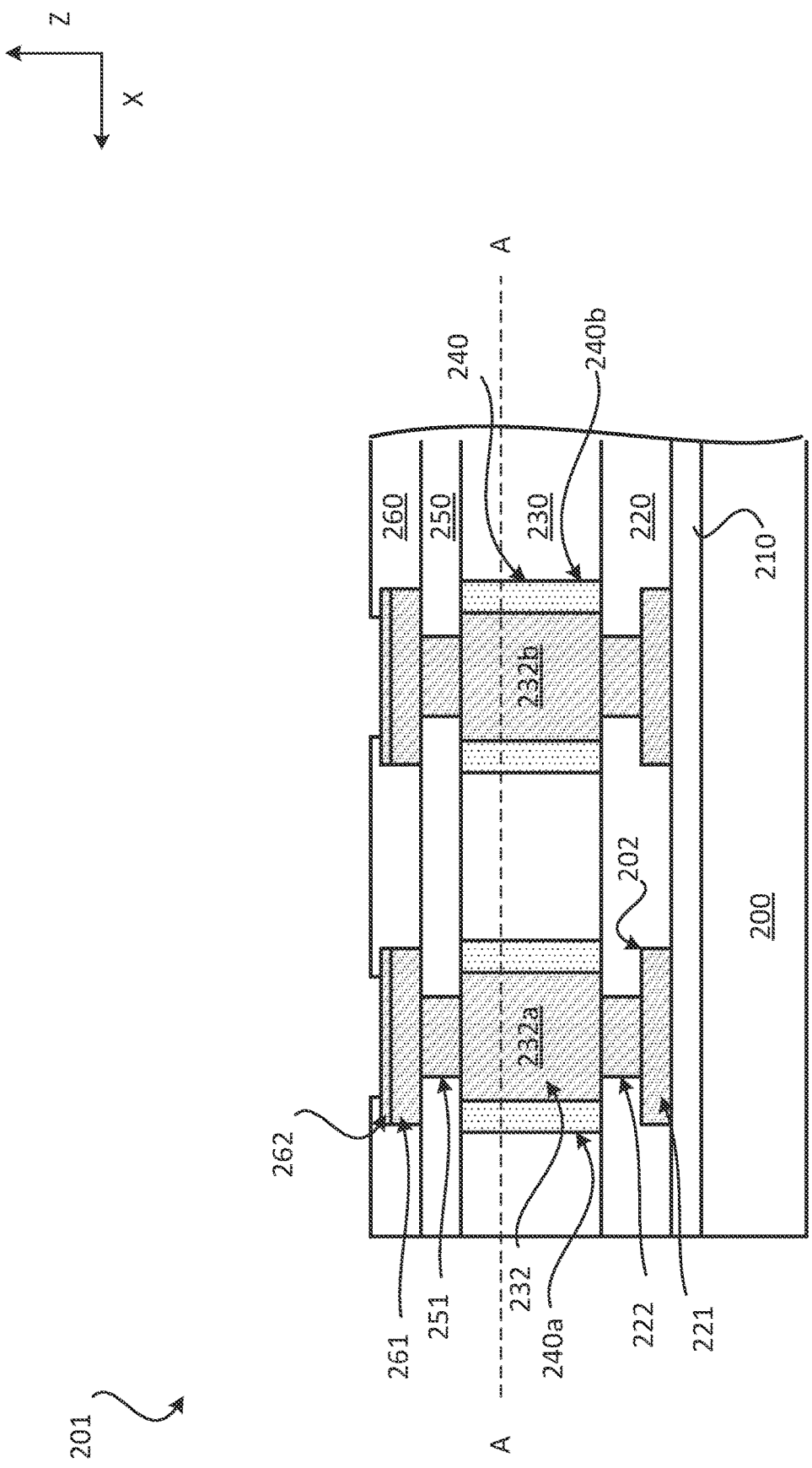
FIG. 2 illustrates an exemplary profile view of an integrated passive device that includes magnetic material that surrounds interconnects.

FIG. 2 illustrates an exemplary profile cross sectional view of an integrated passive device 201. The integrated passive device 201 includes a die substrate 200, a dielectric layer 210, a dielectric layer 220, a dielectric layer 230, a dielectric layer 250, a dielectric layer 260, at least one magnetic layer 240. The integrated passive device 201 may also include a plurality of interconnects 202. The plurality of interconnects 202 may include at least one interconnect 221, at least one interconnect 222, at least one interconnect 232, at least one interconnect 251, at least one interconnect 261 and/or at least one interconnect 262. As will be further described below, at least some of the interconnects from the plurality of interconnects 202 are configured to operate as an inductor (e.g., solenoid inductor). The integrated passive device 201 may be an example of the integrated passive device 105.

The die substrate 200 may include silicon (Si). The die substrate 200 may include a wafer. The die substrate 200 may be free of transistors. The dielectric layer 210 is coupled to a surface of the die substrate 200. The dielectric layer 210, the dielectric layer 220, the dielectric layer 230, the dielectric layer 250 and the dielectric layer 260 may be represented as one or more dielectric layers. Thus, in some implementations, one dielectric layer may represent the dielectric layer 210, the dielectric layer 220, the dielectric layer 230, the dielectric layer 250 and/or the dielectric layer 260, In some implementations, two or more dielectric layers may represent the dielectric layer 210, the dielectric layer 220, the dielectric layer 230, the dielectric layer 250 and/or the dielectric layer 260. The dielectric layer 210, the dielectric layer 220, the dielectric layer 230, the dielectric layer 250 and/or the dielectric layer 260 may include one or more polyimide (PI). In some implementations, the dielectric layer 260 may include a passivation layer.

The at least one interconnect 221 is located over the dielectric layer 210. The at least one interconnect 222 is coupled to the at least one interconnect 232 and the at least one interconnect 221. The at least one interconnect 232 is coupled to the at least one interconnect 251. The at least one interconnect 251 is coupled to the at least one interconnect 261. The at least one interconnect 261 is coupled to the at least one interconnect 262. The at least one interconnect 221, the at least one interconnect 222, the at least one interconnect 232, the at least one interconnect 251 and the at least one interconnect 261 may include copper. In some implementations, the at least one interconnect 262 may include nickel and/or gold. The at least one interconnect 221, at least one interconnect 222, at least one interconnect 232, at least one interconnect 251, at least one interconnect 261 and/or at least one interconnect 262 may be configured to operate as an inductor (e.g. solenoid inductor).

The plurality of interconnects 202 may include a plurality of metallization interconnects. That is for example, in some implementations, at least some of the interconnects from the plurality of interconnects 202 may be implemented as a plurality of metallization interconnects. A plurality of metallization interconnects may include a plurality of redistribution interconnects (e.g., redistribution layer (RDL) interconnects). The at least one interconnect 232 includes an interconnect 232a and an interconnect 232b. The interconnect 232b is planar to the interconnect 232a. The interconnect 232a may be a via interconnect (e.g., first via interconnect). The interconnect 232b may be a via interconnect (e.g., second via interconnect).

As mentioned above, the integrated passive device 201 includes at least one magnetic layer 240. The at least one magnetic layer 240 may include one or more magnetic layers. The at least one magnetic layer 240 includes an insulating layer, a dielectric layer and/or a non-electrical conducting material (e.g., material that does not electrically conduct). The at least one magnetic layer 240 may be both a dielectric material and a magnetic material. Thus, the at least one magnetic layer 240 may have both dielectric properties and magnetic properties. The at least one magnetic layer 240 may include one or more materials. The at least one magnetic layer 240 has a permeability value that is greater than 1 (e.g., about 10 or greater, range of 6-12). The magnetic layer 240 may have different permeability values at different frequencies. The permeability value of a magnetic material and/or a magnetic layer, as described in the disclosure is a relative permeability value that is defined as a ratio of the permeability of a material to the permeability of free space. Thus, the permeability values that are described for the magnetic materials and/or magnetic layers that are illustrated and/or described in the disclosure may represent a relative permeability value that is relative to a defined permeability value (e.g., reference permeability value) of free space. In some implementations, free space may be defined to have a defined permeability value of $\mu_0 = 4\pi \times 10^{-7}$ H/m (Henry per meter). A material that has a relative permeability value that is greater than 1 may be considered to be a magnetic material. Similarly, a material layer that has a relative permeability value that is greater than 1 may be considered to be a magnetic layer. The at least one magnetic layer 240 may include a magnetic loss tangent value that is in a range of about 0.01-0.04. For example, the at least one magnetic layer may include a magnetic loss tangent value that is in a range of about 0.01-0.04 for frequencies up to 100 MHz. The at least one magnetic layer 240 may include may include various magnetic materials. For example, the at least one magnetic layer 240 may include Ajinomoto Magnetic Film (AMF). The at least one magnetic layer 240 is configured to improve the inductance and/or quality factor of an inductor that is located in and/or surrounded by the at least one magnetic layer 240. With improved inductor performance, smaller and more compact inductors may be formed in the integrated passive device and/or the integrated device.

The at least one magnetic layer 240 includes a magnetic layer 240a (e.g., first magnetic layer, first magnetic layer portion) and a magnetic layer 240b (e.g., second magnetic layer, second magnetic layer portion). The magnetic layer 240a laterally surrounds and touches the interconnect 232a. The magnetic layer 240b laterally surrounds and touches the interconnect 232b. The dielectric layer 230 laterally surrounds and touches the magnetic layer 240. For example, the dielectric layer 230 laterally surrounds and touches the magnetic layer 240a and/or the magnetic layer 240b. A portion of the dielectric layer 230 is laterally between the magnetic layer 240a and the magnetic layer 240b.

The use of the dielectric layer 230 to laterally surround the magnetic layer 240a and the magnetic layer 240b helps reduce leakage current that may occur for one or more currents that travel through the interconnect 232a and/or the interconnect 232b. Thus, the use of the dielectric layer 230 helps provide better isolation between one or more currents that travel through interconnect.

Figure 3:
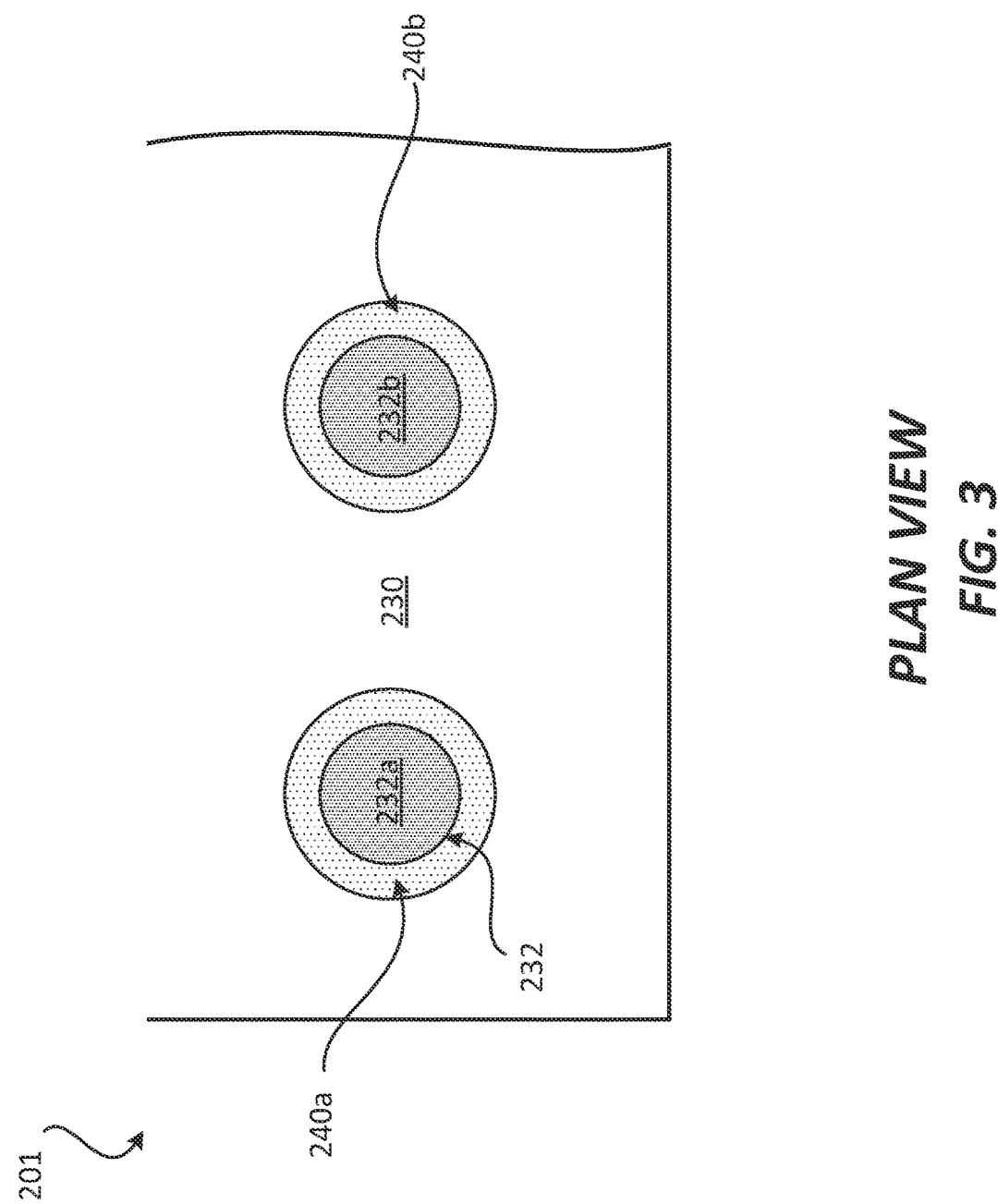
FIG. 3 illustrates an exemplary plan view of an integrated passive device that includes magnetic material that surrounds interconnects.

FIG. 3 illustrates a plan view of cross section AA of part of the integrated passive device 201. As shown in FIG. 3, the magnetic layer 240a laterally surrounds and touches the interconnect 232a, and the magnetic layer 240b laterally surrounds and touches the interconnect 232b. In addition, the dielectric layer 230 laterally surrounds and touches the magnetic layer 240a and the magnetic layer 240b. The dielectric layer 230 may indirectly and laterally surround the interconnect 232a and the interconnect 232b1. In FIG. 3, the dielectric layer 230 does not touch the lateral sides of the interconnect 232a and the interconnect 232b. However, it is noted that in some implementations, the magnetic layer 240a and/or the magnetic layer 240b may not completely surround the lateral sides of the interconnect 232a and/or the interconnect 232b. In such instances, the dielectric layer 230 may touch portions of the lateral sides of the interconnect 232a and/or portions of the lateral sides of the interconnect 232b.

Figure 4:
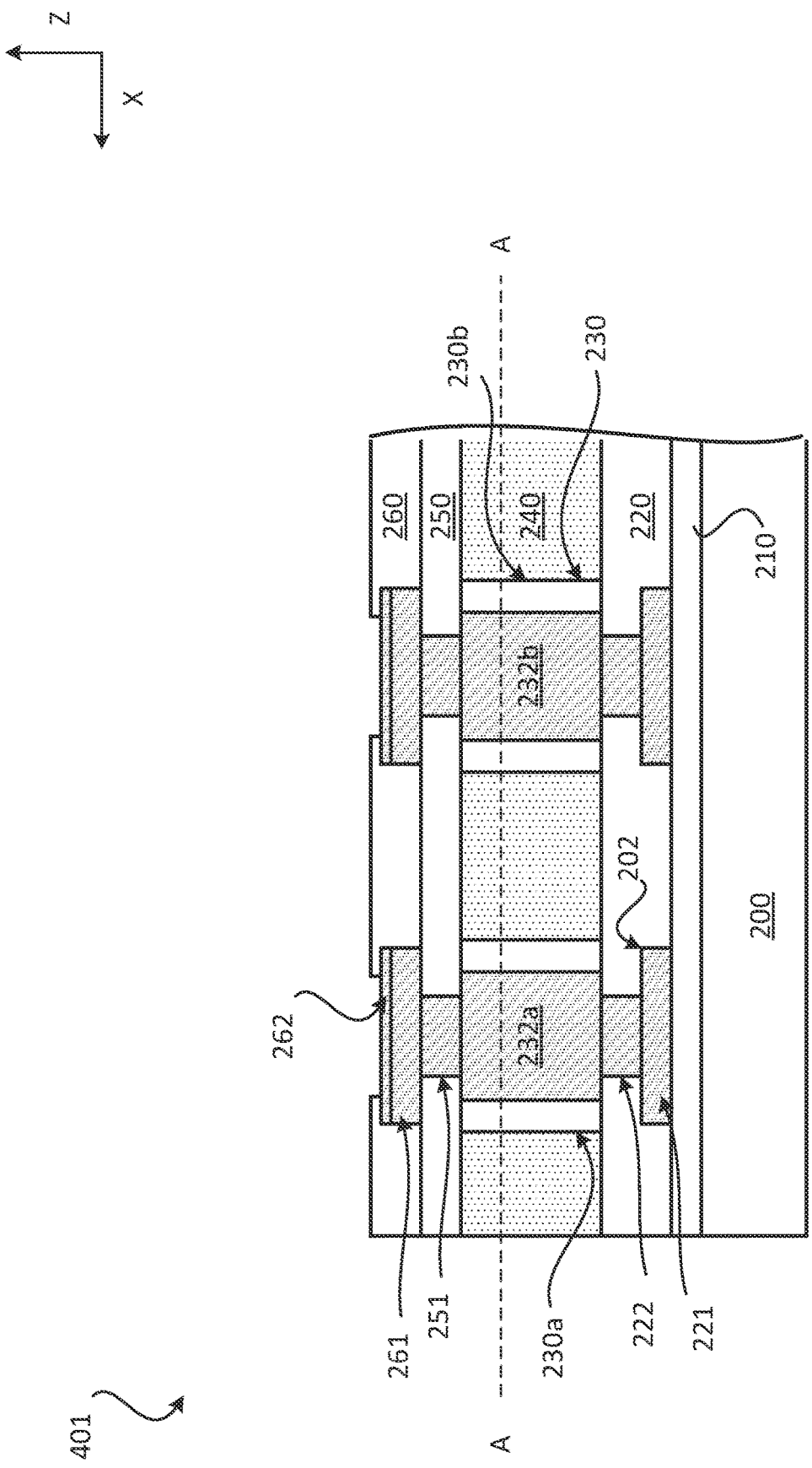
FIG. 4 illustrates an exemplary profile view of an integrated passive device that includes magnetic material that surrounds a dielectric layer around interconnects.

FIG. 4 illustrates an exemplary profile cross sectional view of an integrated passive device 401. The integrated passive device 401 includes a die substrate 200, a dielectric layer 210, a dielectric layer 220, a dielectric layer 230, a dielectric layer 250, a dielectric layer 260, at least one magnetic layer 240. The dielectric layer 230 includes a dielectric layer 230a and a dielectric layer 230b. The integrated passive device 201 may also include a plurality of interconnects 202. The plurality of interconnects 202 may include at least one interconnect 221, at least one interconnect 222, at least one interconnect 232, at least one interconnect 251, at least one interconnect 261 and at least one interconnect 262. At least some of the interconnects from the plurality of interconnects 202 are configured to operate as an inductor (e.g., solenoid inductor). For example, the at least one interconnect 221, at least one interconnect 222, at least one interconnect 232, at least one interconnect 251, at least one interconnect 261 and/or at least one interconnect 262 may lie configured to operate as an inductor (e.g., solenoid inductor). The integrated passive device 401 may be an example of the integrated passive device 105. In some implementations, one dielectric layer may represent the dielectric layer 210, the dielectric layer 220, the dielectric layer 230 (which includes the dielectric layer 230a and the dielectric layer 230b), the dielectric layer 250 and/or the dielectric layer 260. In some implementations, two or more dielectric layers may represent the dielectric layer 210, the dielectric layer 220, the dielectric layer 230, the dielectric layer 250 and/or the dielectric layer 260.

The integrated passive device 401 is similar to the integrated passive device 201. Thus, the integrated passive device 401 may include interconnects that are configured in the same way and/or a similar was as the interconnects from the integrated passive device 201. However, as shown in FIG. 4, the dielectric layer 230a laterally surrounds and touches the interconnect 232a, and the dielectric layer 230b laterally surrounds and touches the interconnect 232b. The magnetic layer 240 laterally surrounds and touches the dielectric layer 230a and the dielectric layer 230b. A portion of the magnetic layer 240 is laterally between the dielectric layer 230a and the dielectric layer 230b. The use of the dielectric layer 230a and/or the dielectric layer 230b in conjunction with the magnetic layer 240 helps reduce leakage current that may occur for one or more currents that travel through the interconnect 232a and/or the interconnect 232b.

Figure 5:
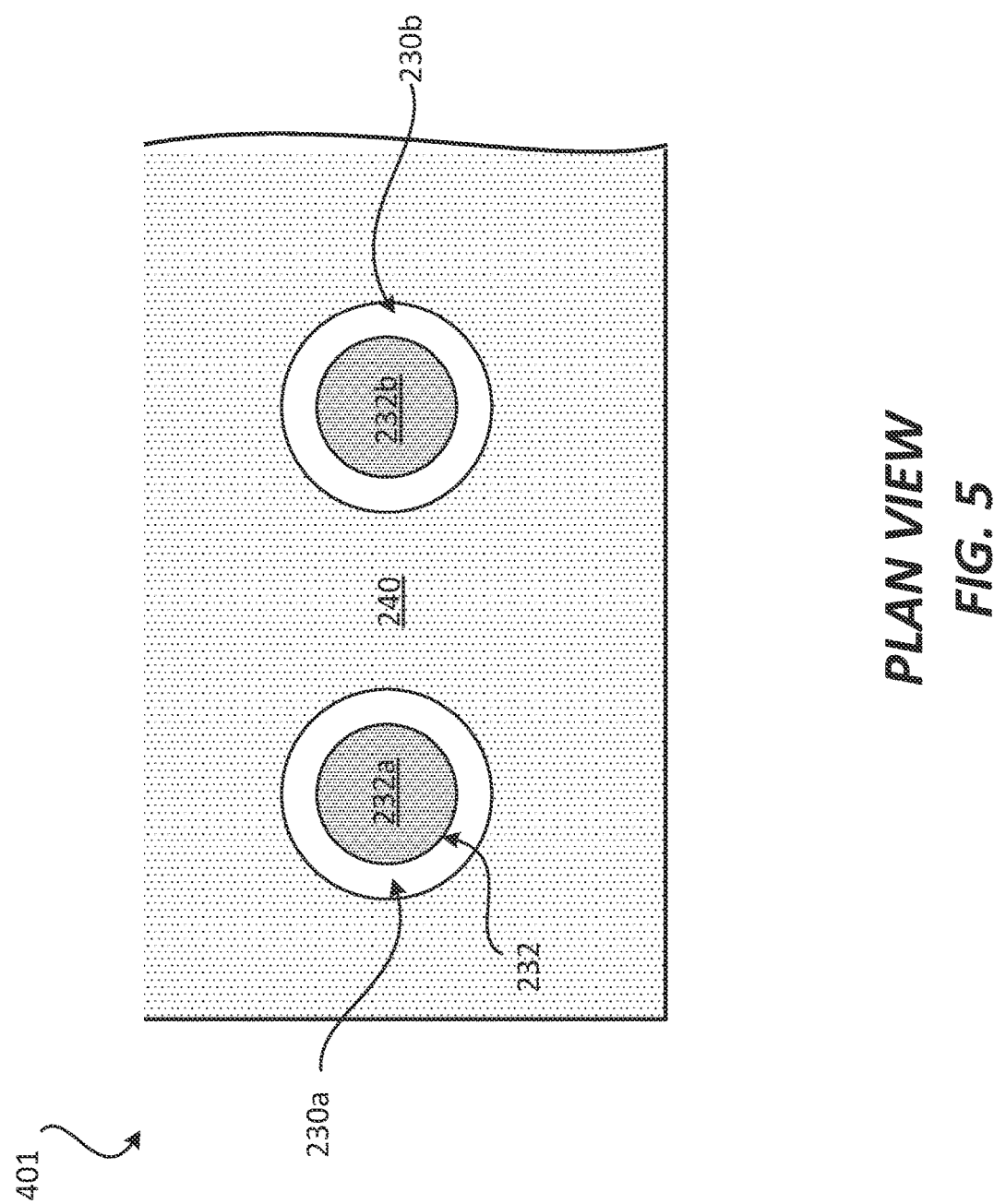
FIG. 5 illustrates an exemplary plan view of an integrated passive device that includes magnetic material that surrounds a dielectric layer around interconnects.

FIG. 5 illustrates a plan view of cross section AA of part of the integrated passive device 401. As shown in FIG. 5, the dielectric layer 230a laterally surrounds and touches the interconnect 232a, and the dielectric layer 230b laterally surrounds and touches the interconnect 232b. In addition, the magnetic layer 240 laterally surrounds and touches the dielectric layer 230a and the dielectric layer 230b. The magnetic layer 240 may indirectly and laterally surround the interconnect 232a and the interconnect 232b. In FIG. 5, the magnetic layer 240 does not touch the lateral sides of the interconnect 232a and the interconnect 232b. However, it is noted that in some implementations, the dielectric layer 230a and/or the dielectric layer 230b may not completely surround the lateral sides of the interconnect 232a and/or the interconnect 232b. In such instances, the magnetic layer 240 may touch portions of the lateral sides of the interconnect 232a and/or portions of the lateral sides of the interconnect 232b.

Figure 6:
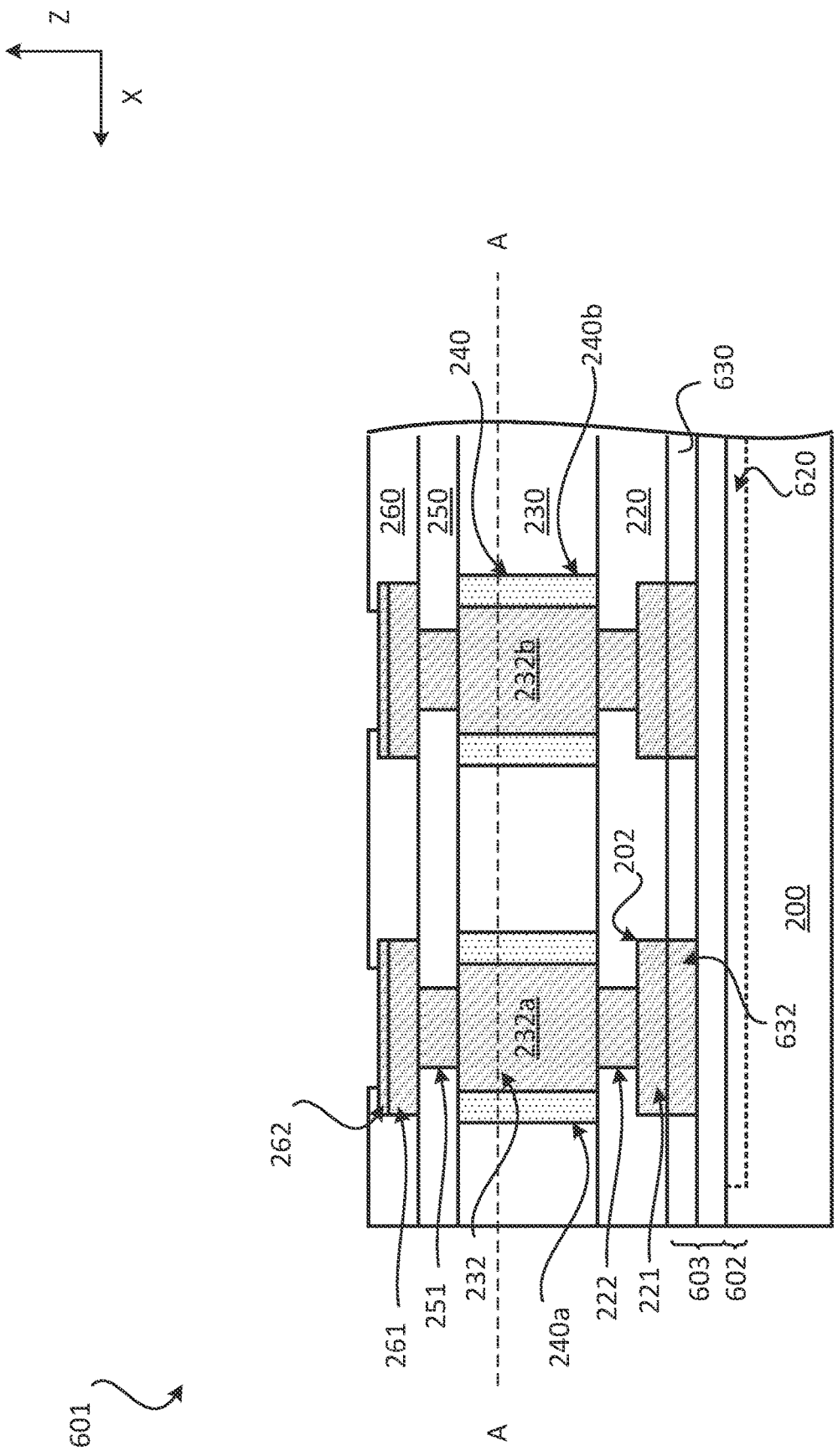
FIG. 6 illustrates an exemplary profile view of an integrated device that includes magnetic material that surrounds interconnects.

FIG. 6 illustrates an exemplary profile cross sectional view of an integrated device 601. The integrated device 601 includes a die substrate 200, an active portion 602, a die interconnection portion 603, a dielectric layer 220, a dielectric layer 230, a dielectric layer 250, a dielectric layer 260, at least one magnetic layer 240. The integrated device 601 may also include a plurality of interconnects 202. The plurality of interconnects 202 may include at least one interconnect 221, at least one interconnect 222, at least one interconnect 232, at least one interconnect 251, at least one interconnect 261 and at least one interconnect 262. At least some of the interconnects from the plurality of interconnects 202 are configured to operate as an inductor (e.g., solenoid inductor). For example, the at least one interconnect 221, at least one interconnect 222, at least one interconnect 232, at least one interconnect 251, at least one interconnect 261 and/or at least one interconnect 262 may be configured to operate as an inductor (e.g., solenoid inductor). The integrated device 601 may be an example of the integrated device 103.

The integrated device 601 is similar to the integrated passive device 201 in using and having the magnetic layer 240. The integrated device 601 include the active portion 602 and the die interconnection portion 603.

The active portion 602 is located in and over the die substrate 200. The active portion 602 may include at least part of the die substrate 200 and a plurality of transistors 620. The plurality of transistors 620 may be formed and/or located in and/or over the die substrate 200. The die substrate 200 may include silicon (Si). The plurality of transistors 620 may form and/or define one or more logical blocks. The plurality of transistors 620 may be any type of transistors (e.g., CMOS transistors, planar transistors, field effect transistors). It is noted that the active portion 602 may include other components that are not shown.

The die interconnection portion 603 is coupled to the active portion 602, the die substrate 200 and the plurality of transistors 620. The die interconnection portion 603 includes at least one die dielectric layer (not shown) and a plurality of die interconnects (not shown). The plurality of die interconnects may be configured to be electrically coupled to the plurality of transistors 620, The die interconnection portion 603 includes a plurality of pad interconnects 632 and a dielectric layer 630. The plurality of pad interconnects 632 may be configured to be electrically coupled to the plurality of transistors 620 through the plurality of die interconnects (not shown) of the die interconnection portion 603. The plurality of pad interconnects 632 are coupled to the at least one interconnect 221. The dielectric layer 220 is located over the dielectric layer 630. The dielectric layer 630 may include a passivation layer.

The magnetic layer 240a laterally surrounds and touches the interconnect 232a, and the magnetic layer 240b laterally surrounds and touches the interconnect 232b. In addition, the dielectric layer 230 laterally surrounds and touches the magnetic layer 240a and the magnetic layer 240b. The dielectric layer 230 may indirectly and laterally surround the interconnect 232a and the interconnect 232b. In FIG. 6, the dielectric layer 230 does not touch the lateral sides of the interconnect 232a and the interconnect 232b. However, it is noted that in some implementations, the magnetic layer 240a and/or the magnetic layer 240b may not completely surround the lateral sides of the interconnect 232a and/or the interconnect 232b. In such instances, the dielectric layer 230 may touch portions of the lateral sides of the interconnect 232a and/or portions of the lateral sides of the interconnect 232b.

Figure 7:
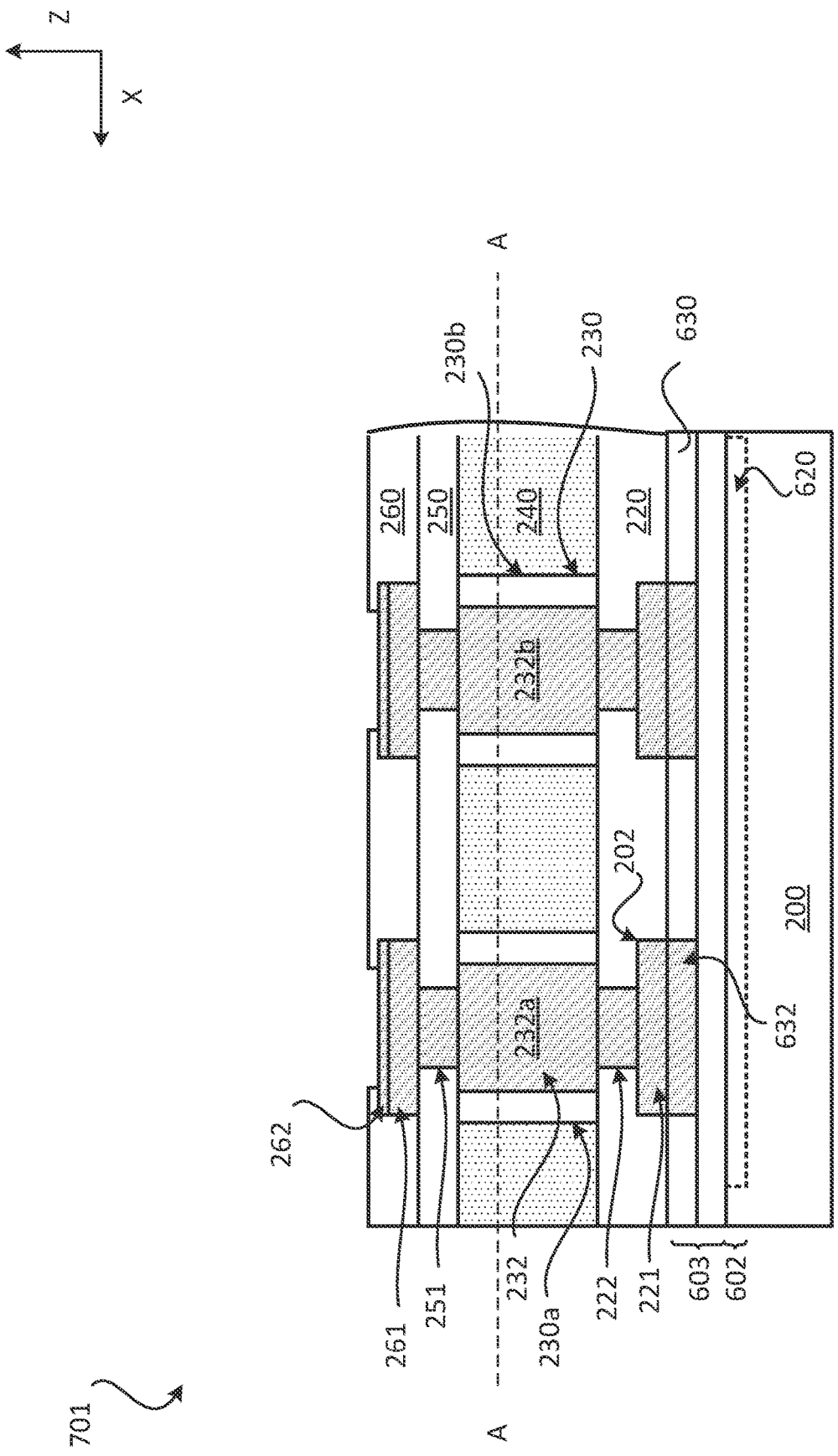
FIG. 7 illustrates an exemplary profile view of an integrated device that includes magnetic material that surrounds a dielectric layer around interconnects.

FIG. 7 illustrates an exemplary profile cross sectional view of an integrated device 701. The integrated device 701 includes a die substrate 200, an active portion 602, a die interconnection portion 603, a dielectric layer 220, a dielectric layer 230, a dielectric layer 250, a dielectric layer 260, at least one magnetic layer 240. The integrated device 601 may also include a plurality of interconnects 202. The plurality of interconnects 202 may include at least one interconnect 221, at least one interconnect 222, at least one interconnect 232, at least one interconnect 251, at least one interconnect 261 and at least one interconnect 262. At least some of the interconnects from the plurality of interconnects 202 are configured to operate as an inductor (e.g., solenoid inductor). For example, the at least one interconnect 221, at least one interconnect 222, at least one interconnect 232, at least one interconnect 251, at least one interconnect 261 and/or at least one interconnect 262 may be configured to operate as an inductor (e.g., solenoid inductor). The integrated device 701 may be an example of the integrated device 103.

The integrated device 701 is similar to the integrated passive device 401 in using and having the magnetic layer 240. The integrated device 701 include the active portion 602 and the die interconnection portion 603.

As shown in FIG. 7, the dielectric layer 230a laterally surrounds and touches the interconnect 232a, and the dielectric layer 230b laterally surrounds and touches the interconnect 232b. In addition, the magnetic layer 240 laterally surrounds and touches the dielectric layer 230a and the dielectric layer 230b. The magnetic layer 240 may indirectly and laterally surround the interconnect 232a and the interconnect 232b. A portion of the magnetic layer 240 is laterally between the dielectric layer 230a and the dielectric layer 230b. In FIG. 7, the magnetic layer 240 does not touch the lateral sides of the interconnect 232a and the interconnect 232b, However, it is noted that in some implementations, the dielectric layer 230a and/or the dielectric layer 230b may not completely surround the lateral sides of the interconnect 232a and/or the interconnect 232b. In such instances, the magnetic layer 240 may touch portions of the lateral sides of the interconnect 232a and/or portions of the lateral sides of the interconnect 232b.

Figure 8:
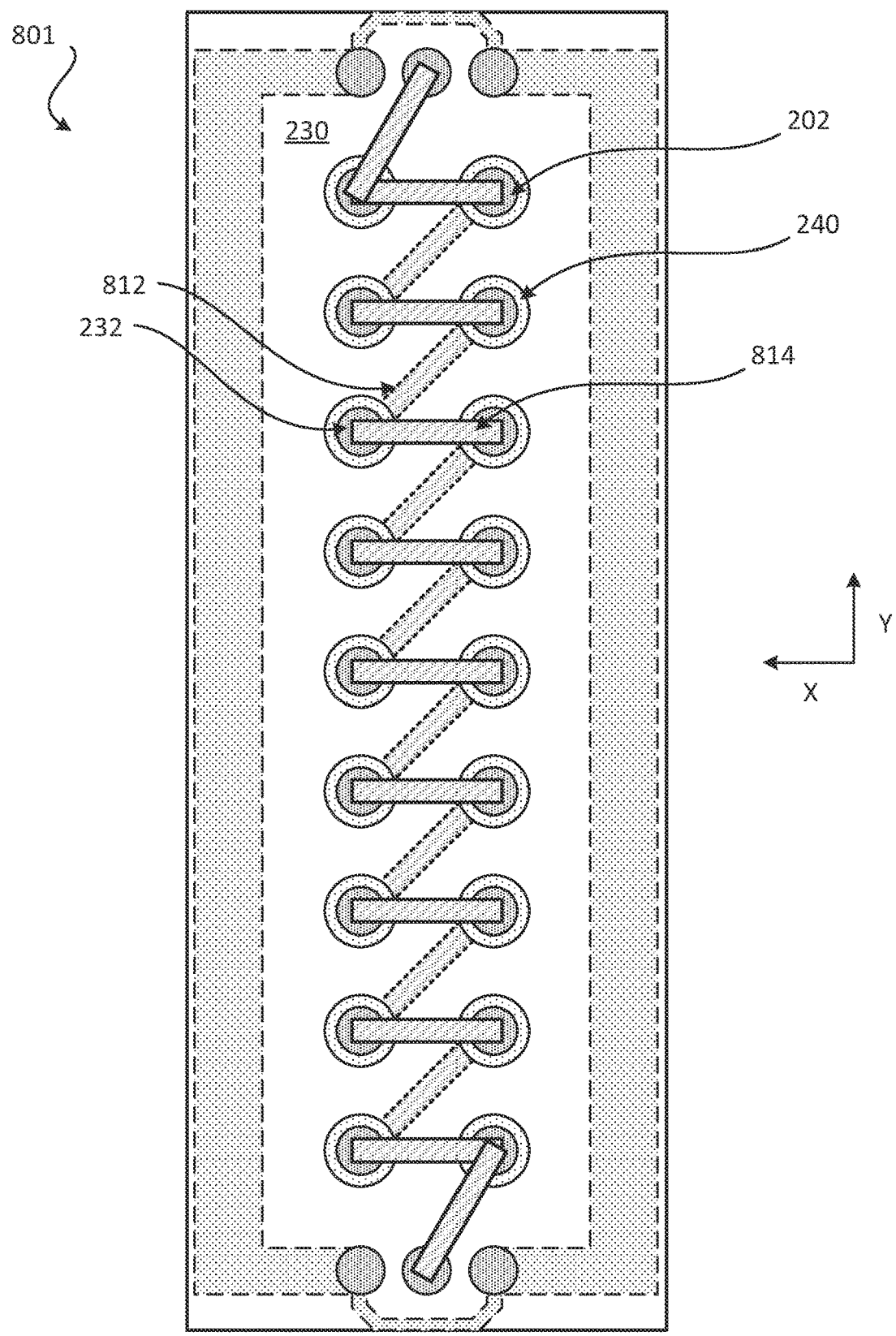
FIG. 8 illustrates an exemplary plan view of an integrated passive device that includes magnetic material that surrounds interconnects.

FIG. 8 illustrates a plan view of an integrated passive device 801. The integrated passive device 801 may be similar to the integrated passive device 201. The plan view of the integrated passive device 801 may be across a cross section that is similar to the cross section AA of the integrated passive device 201. The integrated passive device 801 includes a plurality of interconnects 202, at least one dielectric layer 230 and at least one magnetic layer 240. The plurality of interconnects 202 includes the plurality of interconnects 232, a plurality of interconnects 812 and a plurality of interconnects 814. The plurality of interconnects 232, the plurality of interconnects 812 and the plurality of interconnects 814 are configured to operate as an inductor (e.g., solenoid inductor). The plurality of interconnects 232 are coupled (e.g., directly coupled, indirectly coupled) to the plurality of interconnects 812 and the plurality of interconnects 814. The plurality of interconnects 812 and/or the plurality of interconnects 814 may include pad interconnects and/or trace interconnects. The plurality of interconnects 232 may include one or more via interconnects that are laterally surrounded by the magnetic layer 240. The magnetic layer 240 is touching the lateral sides of the plurality of interconnects 232. The dielectric layer 230 laterally surrounds and touches the lateral sides of the magnetic layer 240. The plurality of interconnects 812 may be located on first metal layer (e.g., bottom metal layer) of the integrated passive device 801. The plurality of interconnects 814 may be located on second metal layer (e.g., top metal layer) of the integrated passive device 801. Thus, in one implementation, the plurality of interconnects 812 are located below the plurality of interconnects 232, and the plurality of interconnects 814 are located above the plurality of interconnects 232.

In some implementations, each of the interconnects from the plurality of interconnects 232 is laterally and completely surrounded by the magnetic layer 240. However, in some implementations, one or more of the interconnects from the plurality of interconnects 232 may lie laterally and partially surrounded by the magnetic layer 240, such that the magnetic layer 240 is touching some but not all of the lateral sides of interconnects from the plurality of interconnects 232. In some implementations, one or more of the interconnects from the plurality of interconnects 232 is not laterally surrounded by the magnetic layer 240 such that the magnetic layer 240 is not touching any part of the lateral side of interconnects from the plurality of interconnects 232.

It is noted that the configuration of the integrated passive device 801 may be applicable to an integrated device that includes a plurality of transistors. For example, the configuration of the integrated passive device 801 may be applicable to the integrated device 601.

Figure 9:
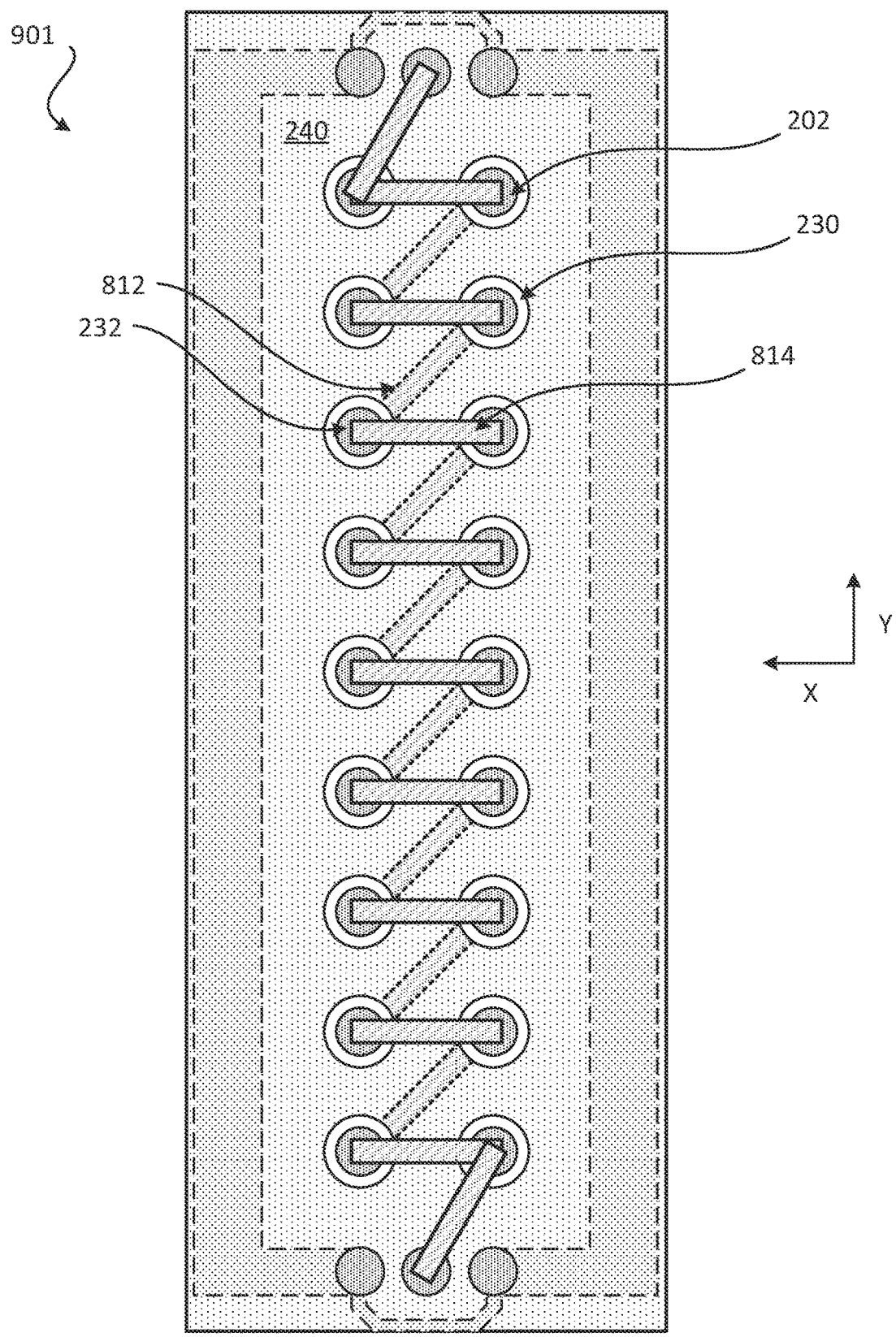
FIG. 9 illustrates an exemplary plan view of an integrated passive device that includes magnetic material that surrounds a dielectric layer around interconnects.

FIG. 9 illustrates a plan view of an integrated passive device 901. The integrated passive device 901 may be similar to the integrated passive device 401. The plan view of the integrated passive device 901 may be across a cross section that is similar to the cross section AA of the integrated passive device 401. The integrated passive device 901 includes a plurality of interconnects 202, at least one dielectric layer 230 and at least one magnetic layer 240. The plurality of interconnects 202 includes the plurality of interconnects 232, a plurality of interconnects 812 and a plurality of interconnects 814. The plurality of interconnects 232, the plurality of interconnects 812 and the plurality of interconnects 814 are configured to operate as an inductor (e.g., solenoid inductor). The plurality of interconnects 232 are coupled (e.g., directly coupled, indirectly coupled) to the plurality of interconnects 812 and the plurality of interconnects 814. The plurality of interconnects 812 and/or the plurality of interconnects 814 may include pad interconnects and/or trace interconnects. The plurality of interconnects 232 may include one or more via interconnects that are laterally surrounded by the dielectric layer 230. The dielectric layer 230 is touching the lateral sides of the plurality of interconnects 232. The magnetic layer 240 laterally surrounds and touches the lateral sides of the dielectric layer 230. The plurality of interconnects 812 may lie located on first metal layer (e.g., bottom metal layer) of the integrated passive device 901. The plurality of interconnects 814 may be located on second metal layer (e.g., top metal layer) of the integrated passive device 901. Thus, in one implementation, the plurality of interconnects 812 are located below the plurality of interconnects 232, and the plurality of interconnects 814 are located above the plurality of interconnects 232.

In some implementations, each of the interconnects from the plurality of interconnects 232 is laterally and completely surrounded by the dielectric layer 230. However, in some implementations, one or more of the interconnects from the plurality of interconnects 232 may be laterally and partially surrounded by the dielectric layer 230, such that the dielectric layer 230 is touching some but not all of the lateral sides of interconnects from the plurality of interconnects 232. In some implementations, one or more of the interconnects from the plurality of interconnects 232 is not laterally surrounded by the dielectric layer 230 such that the dielectric layer 230 is not touching any part of the lateral side of interconnects from the plurality of interconnects 232.

It is noted that the configuration of the integrated passive device 901 may be applicable to an integrated device that includes a plurality of transistors. For example, the configuration of the integrated passive device 901 may be applicable to the integrated device 701.

An integrated device (e.g., 103, 601, 701) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103, 601, 701) may include at least one electronic circuit (e.g., first electronic circuit, second electronic circuit, etc. . . . ). An integrated device may include transistors. An integrated device may be an example of an electrical component and/or electrical device. In some implementations, an integrated device may include a chiplet. A chiplet may be fabricated using a process that provides better yields compared to other processes that are used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that perform several functions may reduce the overall cost of a package relative to using a single chip to perform all of the functions of a package.

Having described various integrated devices and/or integrated passive devices with at least one magnetic layer, a process for fabricating an integrated device with at least one magnetic layer will be described below.

Figure 10A:
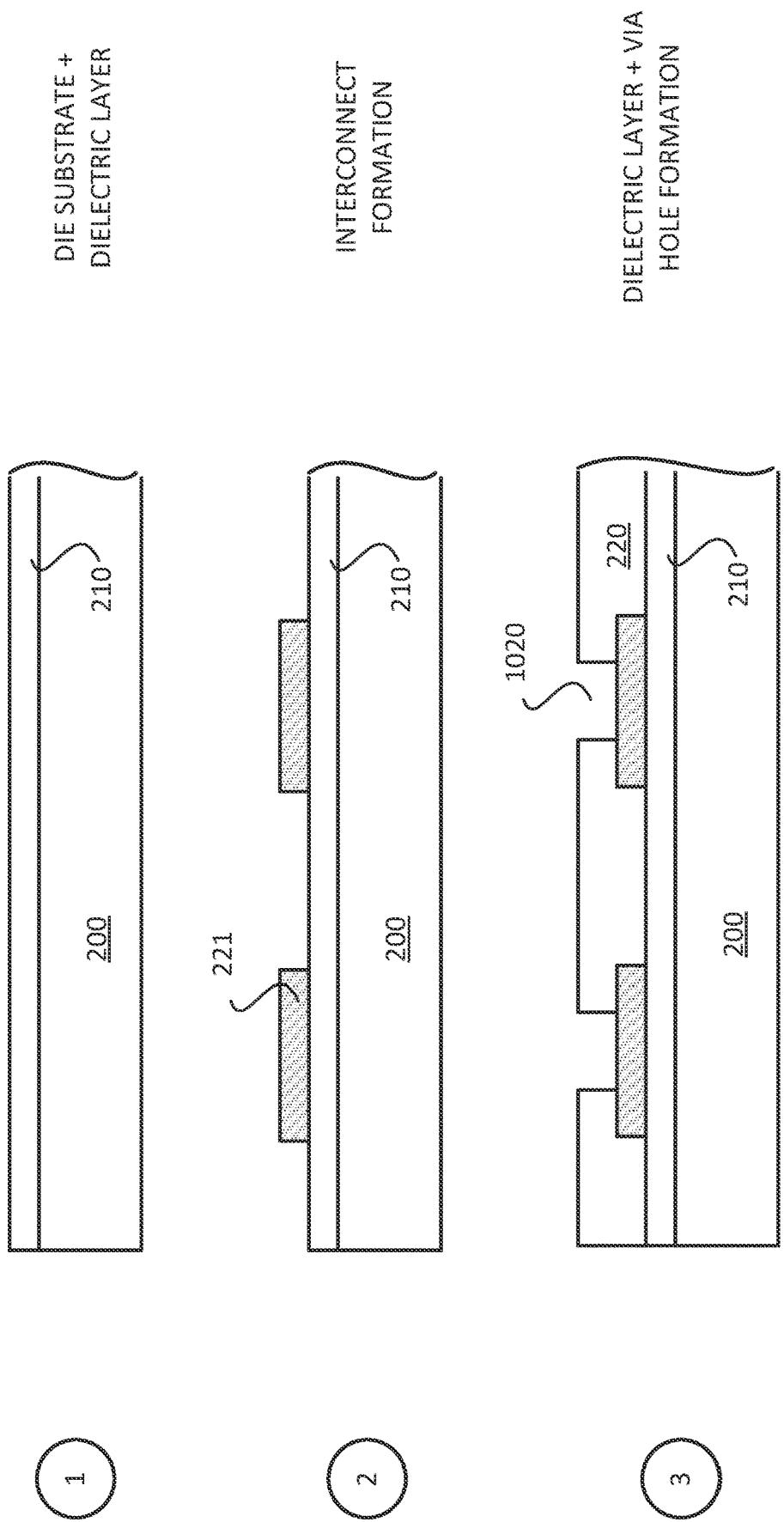
FIGS. 10A-10E illustrate an exemplary sequence for fabricating an integrated passive device that includes a magnetic material that surrounds a dielectric layer around interconnects.

Exemplary Sequence for Fabricating an Integrated Passive Device Comprising Magnetic Layer FIGS. 10A-OE illustrate an exemplary sequence for providing or fabricating an integrated passive device comprising at least one magnetic layer. In some implementations, the sequence of FIGS. 10A-10E may be used to provide or fabricate the integrated passive device 105 and/or the integrated passive device 401 described in the disclosure. In some implementations, the sequence of FIGS. 10A-10E may be used to provide or fabricate the integrated device 103 and/or the integrated device 701 described in the disclosure.

It should be noted that the sequence of FIGS. 10A-10E may combine one or more stages in order to simplify and/or clarify the sequence for providing or fabricating an integrated passive device. In some implementations, the order of the processes may be changed or modified. In some implementations, one or more of processes may be replaced or substituted without departing from the spirit of the disclosure. Different implementations may fabricate an integrated passive device differently. The sequence shown in FIGS. 10A-10E may be implemented on a wafer (e.g., silicon wafer) and then singulated into several integrated passive devices. A similar approach may be implemented for integrated devices with a magnetic layer.

Stage 1, as shown in FIG. 10A, illustrates a state after a die substrate 200 is provided. The die substrate 200 may include silicon (Si). A dielectric layer 210 may be located over a surface of the die substrate 200. The die substrate 200 may be provided with the dielectric layer 210. In some implementations, the dielectric layer 210 may be formed over the surface of the die substrate 200. Providing the die substrate 200 may include providing a wafer (e.g., silicon wafer). In some implementations, a die substrate 200 may be provided with a plurality of transistors.

Stage 2 illustrates a state after at least one interconnect 221 is formed over the dielectric layer 210. A plating process and a patterning process may be used to form the at least one interconnect 221.

Stage 3 illustrates a state after at least one dielectric layer 220 is formed and patterned. A deposition, a lamination, an exposure, a development and/or an etching process may be used to form and pattern the at least one dielectric layer 220. The at least one dielectric layer 220 may be formed over and around the at least one interconnect 221. The at least one dielectric layer 220 may include at least one via-hole 1020.

Figure 10B:
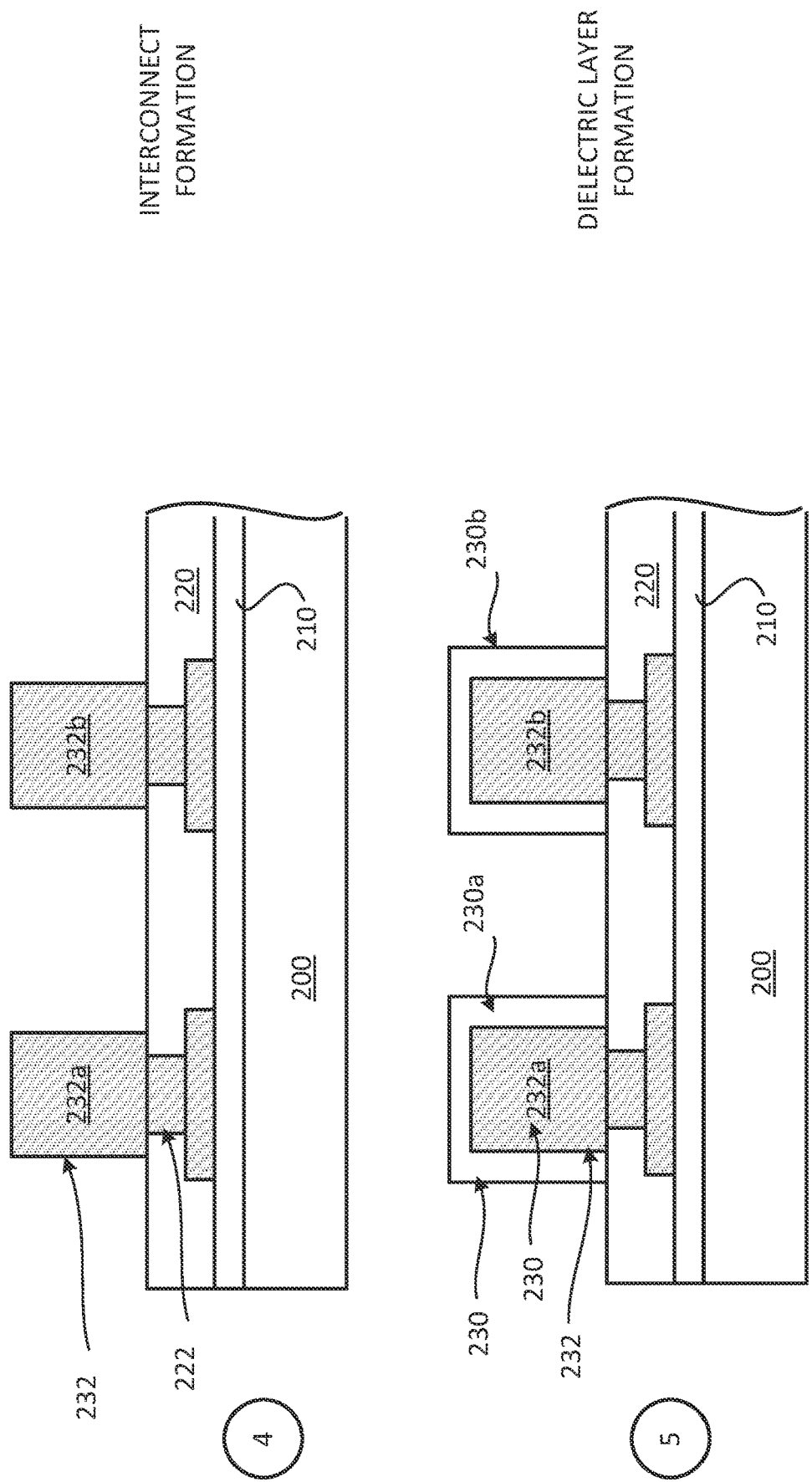

Stage 4, as shown in FIG. 10B, illustrates a state after at least one interconnect 222 and at least one interconnect 232 are formed. A plating process and a patterning process may be used to form the at least one interconnect 222 and the at least one interconnect 232. Forming the at least one interconnect 222 may include forming via interconnects in the at least one via-hole 1020 of the at least one dielectric layer 220. The at least one interconnect 222 may be coupled to the at least one interconnect 221 and the at least one interconnect 232. The at least one interconnect 232 includes an interconnect 232a and an interconnect 232b. A width of the at least one interconnect 232 may be greater than a width of the at least one interconnect 222.

Stage 5 illustrates a state after at least one dielectric layer 230 is formed and patterned. A deposition, a lamination, an exposure, a development and/or an etching process may be used to form and pattern the at least one dielectric layer 230. The at least one dielectric layer 230 may be formed over and around the at least one interconnect 232. The at least one dielectric layer 230 includes a dielectric layer 230a and a dielectric layer 230b. The at least one dielectric layer 230a laterally surrounds and touches the interconnect 232a. The at least one dielectric layer 230a is located above the interconnect 232a. The at least one dielectric layer 230b laterally surrounds and touches the interconnect 232b. The at least one dielectric layer 230b is located above the interconnect 232b.

Figure 10C:
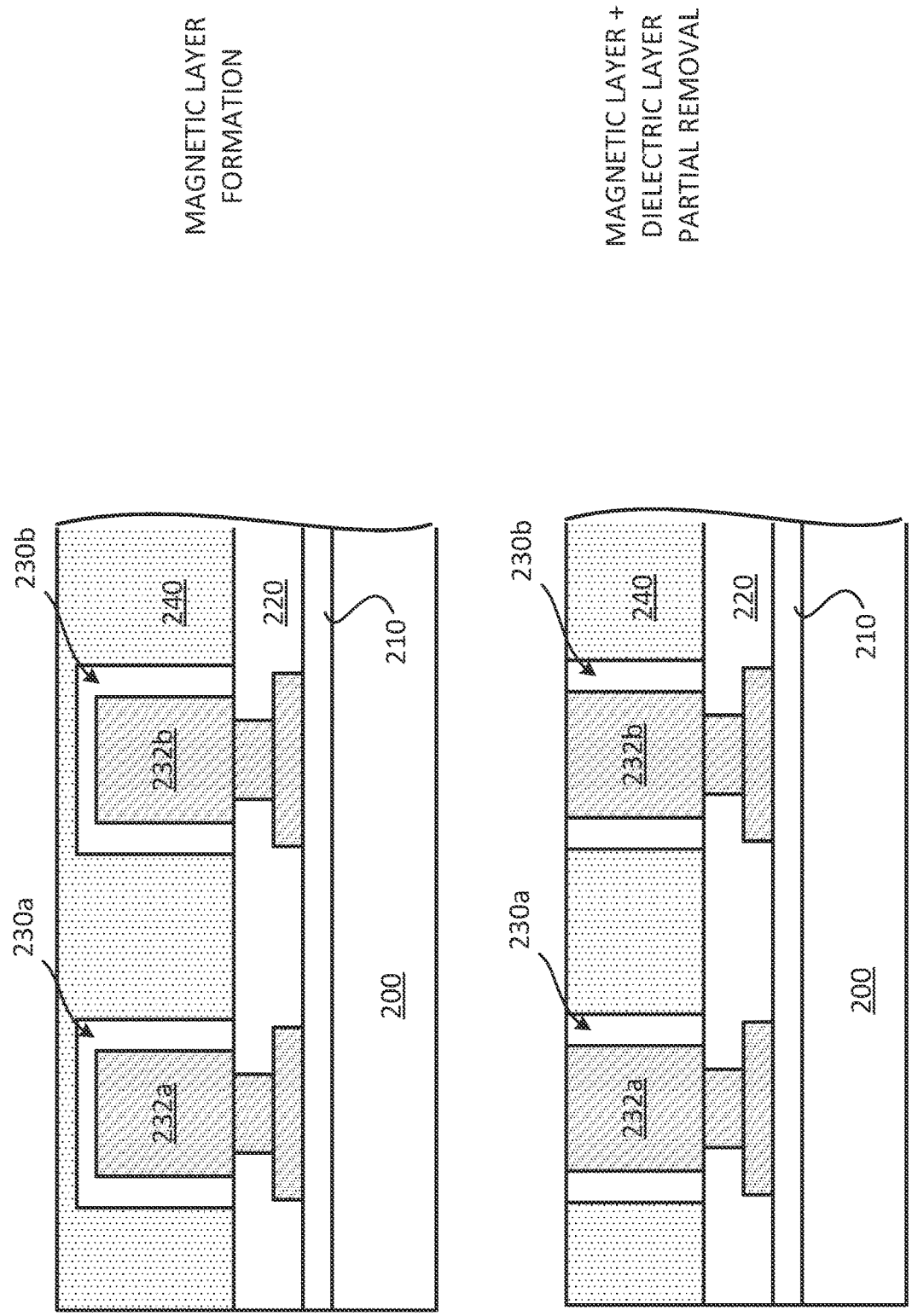

Stage 6, as shown in FIG. 10C, illustrates a state after a magnetic layer 240 is formed over the dielectric layer 220 and the dielectric layer 230 (which includes the dielectric layer 230a and the dielectric layer 230b). A lamination process may be used to form the magnetic layer 240. A printing process may be used to form paste of the magnetic layer 240 over the dielectric layer 220 and the dielectric layer 230.

Stage 7 illustrates a state after portions of the magnetic layer 240 and portions of the dielectric layer 230 are removed. A polishing process and/or a grinding process may be used to remove portions of the magnetic layer 240 and portions of the dielectric layer 230. Removing portions of the magnetic layer 240 and portions of the dielectric layer 230 exposes the at least one interconnect 232. It is noted that portions of the at least one interconnect 232 may also be removed through the polishing and/or grinding process.

Figure 10D:
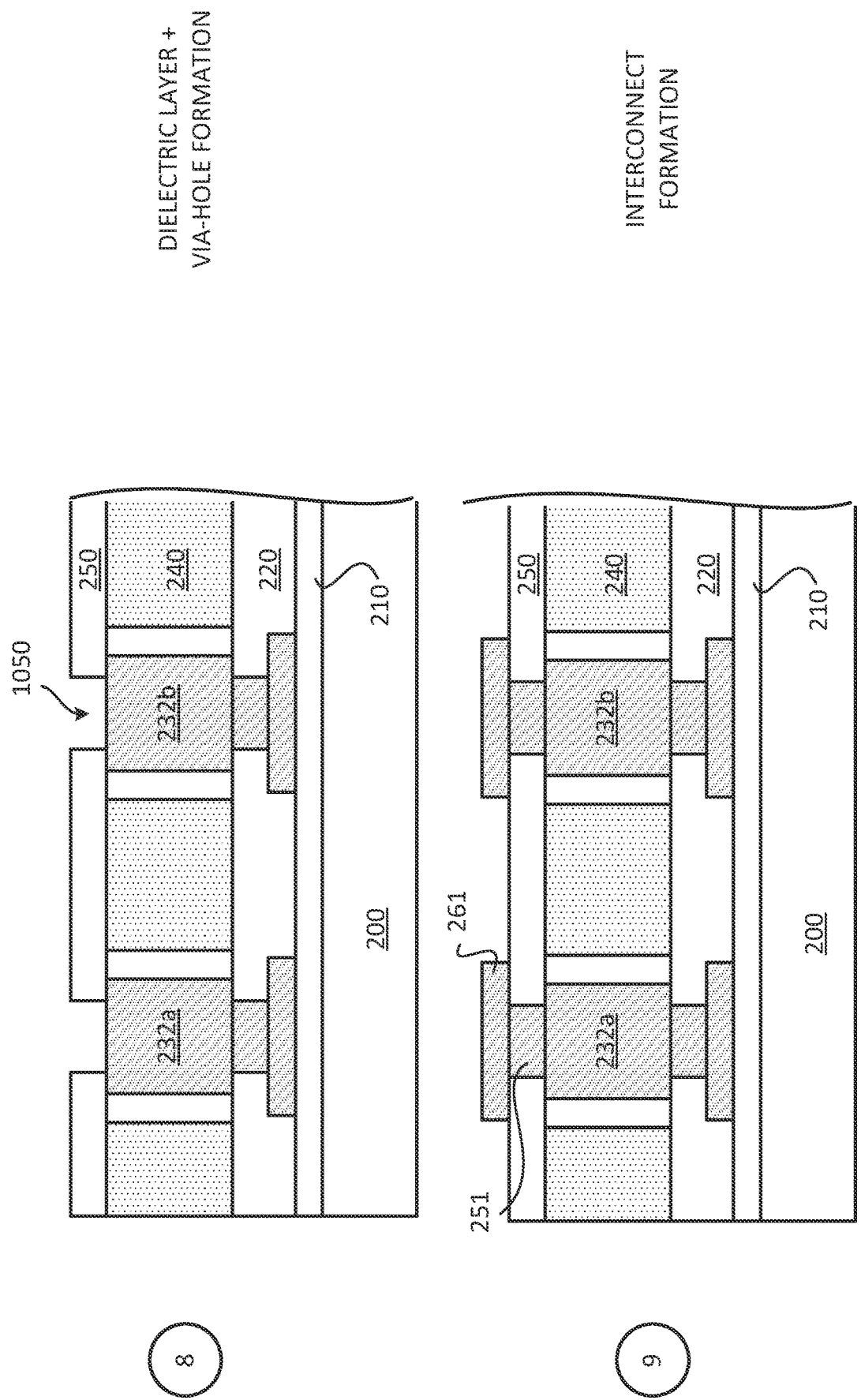

Stage 8, as shown in FIG. 10D, illustrates a state after at least one dielectric layer 250 is formed and patterned. A deposition, a lamination, an exposure, a development and/or an etching process may be used to form and pattern the at least one dielectric layer 250. The at least one dielectric layer 250 may be formed over and around the at least one interconnect 232, the dielectric layer 230 and the magnetic layer 240. The at least one dielectric layer 250 may include at least one via-hole 1050.

Stage 9 illustrates a state after the at least one interconnect 251 and at least one interconnect 261 are formed. A plating process and a patterning process may be used to form the at least one interconnect 251 and the at least one interconnect 261. Forming the at least one interconnect 251 may include forming via interconnects in the at least one via-hole 1050 of the at least one dielectric layer 250. The at least one interconnect 251 may be coupled to the at least one interconnect 232 and the at least one interconnect 261.

Figure 10E:
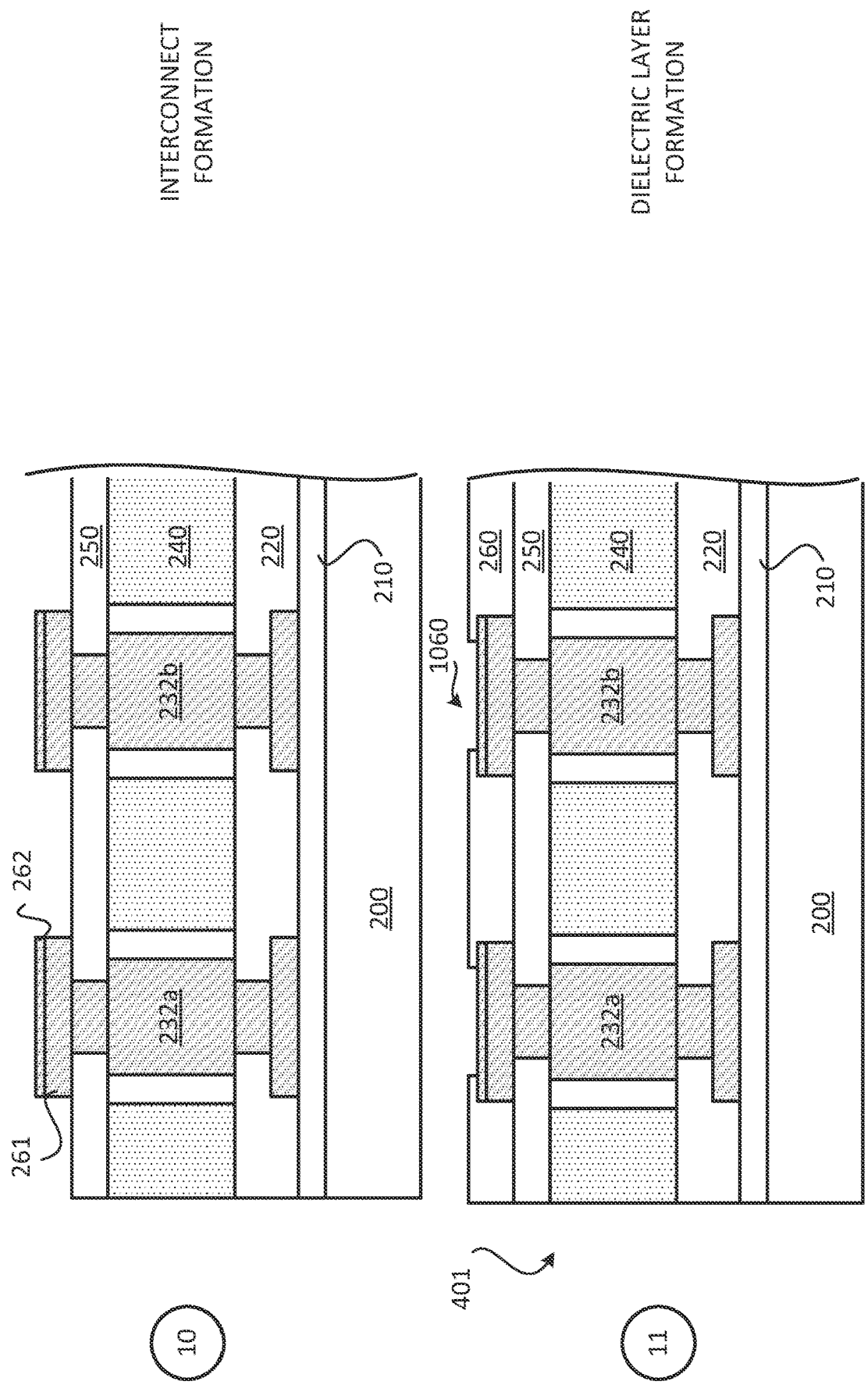

Stage 10, as shown in FIG. 10E, illustrates a state after the at least one interconnect 262 is formed. A plating process and a patterning process may be used to form the at least one interconnect 262. The at least one interconnect 262 is formed and coupled to the at least one interconnect 261. The at least one interconnect 262 may include nickel and/or gold.

Stage 11 illustrates a state after at least one dielectric layer 260 is formed and patterned. A deposition, a lamination, an exposure, a development and/or an etching process may be used to form and pattern the at least one dielectric layer 260. The at least one dielectric layer 260 may include at least one opening 1060, which is configured as an opening in the dielectric layer 260 and exposes the interconnect 261 and/or the interconnect 262. A solder interconnect may be configured to be coupled to the interconnect 262 and/or the interconnect 261 through the opening in the dielectric layer 260.

As mentioned above, the above sequence may be performed on a wafer (e.g., silicon wafer) such that several integrated passive devices are formed at the same time, and the wafer is then singulated to form individual integrated passive devices comprising a magnetic layer. The above sequence may be fabricated in one facility or at several facilities. For example, when a wafer includes an active portion and an interconnection portion, a portion that includes the magnetic layer may be fabricated over the interconnection portion. The wafer comprising the active portion, the interconnection portion and the magnetic layer may be singulated to form several integrated devices.

Figure 11:
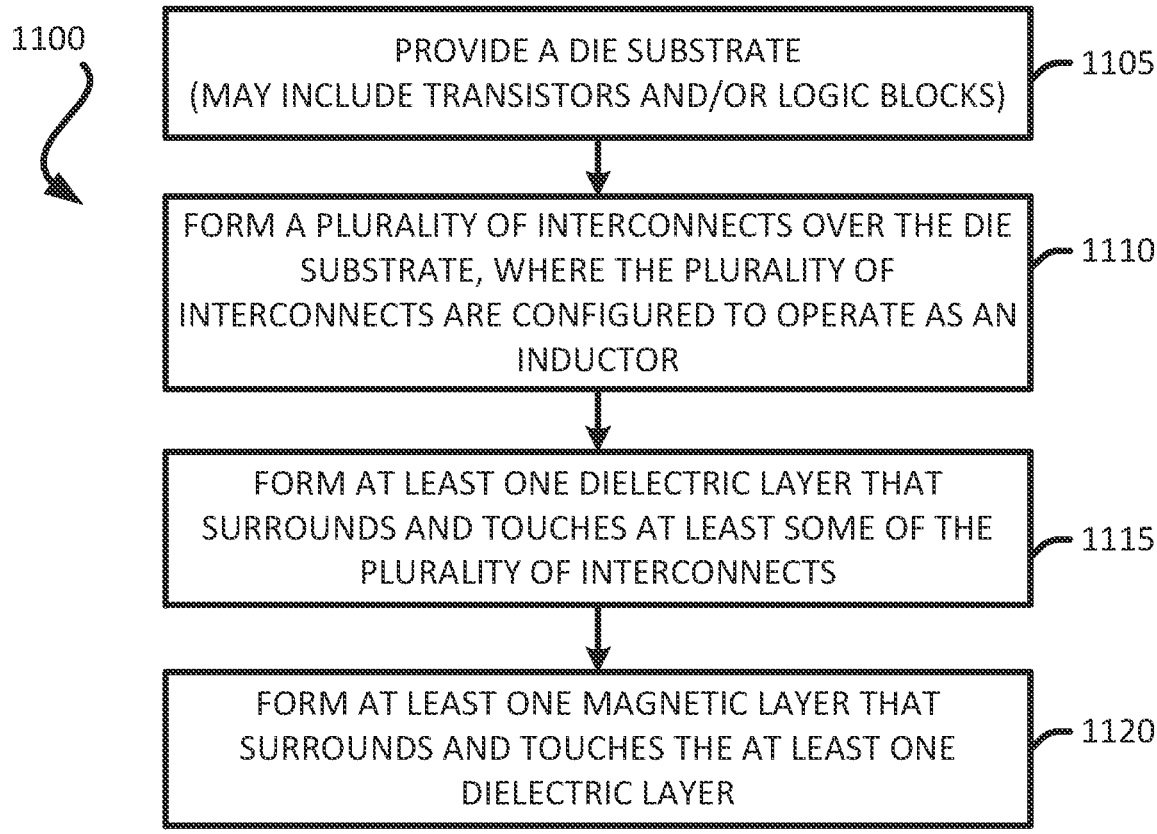
FIG. 11 illustrates an exemplary flow diagram of a method for fabricating an integrated passive device that includes a magnetic material that surrounds a dielectric layer around interconnects.

Exemplary Flow Diagram of a Method for Fabricating an Integrated Passive Device Comprising Magnetic Layer In some implementations, fabricating an integrated device includes several processes, FIG. 11 illustrates an exemplary flow diagram of a method 1100 for providing or fabricating an integrated passive device that includes at least one magnetic layer. In some implementations, the method 1100 of FIG. 11 may be used to provide or fabricate the integrated passive device 105 and/or the integrated passive device 401.

The method 1100 may be implemented on a wafer (e.g., silicon wafer) and then singulated into several integrated passive devices.

It should be noted that the method 1100 of FIG. 11 may combine one or more processes in order to simplify and/or clarify the method for providing or fabricating an integrated passive device. In some implementations, the order of the processes may be changed or modified. Moreover, the method 1100 of FIG. 11 may be implemented to provide or fabricate an integrated device (e.g., 103) with at least one magnetic layer.

The method provides (at 1105) a die substrate (e.g., 200). The die substrate 200 may include silicon (Si). The die substrate 200 may include a wafer (e.g., silicon wafer). A dielectric layer may be formed and/or located over the die substrate 200. A plurality of transistors 620 may be formed in and/or over the die substrate 200. A plurality of logic blocks may be formed and/or defined by the plurality of transistors 620. When fabricating an integrated passive device, the die substrate 200 may be free of the plurality of transistors (e.g., free of active devices). Stage 1 of FIG. 10A, illustrates and describes an example of providing a die substrate.

The method forms (at 1110) a plurality of interconnects (e.g., 202) over the die substrate, where at least some of the interconnects from the plurality of interconnects (e.g., 202) are configured to operate as an inductor. A plating process and a patterning process may be used to form the at least one interconnect 202. The plurality of interconnects 202 may include the plurality of interconnects 232. The plurality of interconnects may be formed in and/or over at least one dielectric layer.

The method forms and patterns (at 1115) at least one dielectric layer (e.g., 220, 230, 250, 260). The at least one dielectric layer 230 may laterally surround and touch at least some of the interconnect from a plurality of interconnects 232. A deposition, a lamination, an exposure, a development and/or an etching process may be used to form and pattern the at least one die dielectric layer (e.g., 220, 230, 250, 260). It is noted that forming the plurality of interconnects and the at least one dielectric layer may be performed iteratively. That is, a dielectric layer may be formed followed by forming a plurality of interconnects, then forming another dielectric layer and then forming another plurality of interconnects. Thus, the method forming (at 1110) the plurality of interconnects and forming (at 1115) at least one dielectric layer may be performed iteratively for as many layers as required. In some implementations, the dielectric layer is formed and then the plurality of interconnects are formed. At least one of the dielectric layer (e.g., 230) is formed such that the dielectric layer (e.g., 230) laterally surrounds and touches at least some of the lateral sides of some of the interconnects from the plurality of interconnects. Stages 2 of FIG. 10A through Stage 5 of FIG. 10B, and Stages 8 of FIG. 10D through Stage 11 of FIG. 11E, illustrate and describe an example of forming a plurality of interconnects and forming at least one dielectric layer.

The method forms (at 1120) at least one magnetic layer (e.g., 240). A printing process that provide a magnetic layer as paste may be used to provide and form the at least one magnetic layer 240. The at least one magnetic layer 240 may be formed in between when the plurality of interconnects are formed and when the at least one dielectric layer are formed. For example, the magnetic layer 240 may be formed after at least one dielectric layer is formed and a plurality of interconnects are formed. In some implementations, once the magnetic layer 240 is formed, additional dielectric layers and an additional plurality of interconnects may be formed. Stages 6 and 7 of FIG. 10C, illustrate and describe an example of forming a magnetic layer.

Exemplary Sequence for Fabricating an Integrated Device Comprising Magnetic Layer FIGS. 12A-12E illustrate an exemplary sequence for providing or fabricating an integrated device comprising at least one magnetic layer. In some implementations, the sequence of FIGS. 12A-12E may be used to provide or fabricate the integrated device 103 and/or the integrated device 601 described in the disclosure. In some implementations, the sequence of FIGS. 12A-12E may be used to provide or fabricate the integrated passive device 105 and/or the integrated passive device 201 described in the disclosure.

It should be noted that the sequence of FIGS. 12A-12E may combine one or more stages in order to simplify and/or clarify the sequence for providing or fabricating an integrated device. In some implementations, the order of the processes may be changed or modified. In some implementations, one or more of processes may be replaced or substituted without departing from the spirit of the disclosure. Different implementations may fabricate an integrated device differently. The sequence shown in FIGS. 12A-12E may be implemented on a wafer (e.g., silicon wafer) and then singulated into several integrated devices, A similar approach may be implemented for integrated passive devices with a magnetic layer.

Stage 1, as shown in FIG. 12A, illustrates a state after a die substrate 200 is provided. The die substrate 200 may include silicon (Si). The die substrate 200 may be part of an integrated device (e.g., 601). The integrated device 601 may include the die substrate 200, an active portion 602 and a die interconnection portion 603. The active portion 602 may include a plurality of transistors 620. The die interconnection portion 603 is coupled to the active portion 602, the die substrate 200 and the plurality of transistors 620. The die interconnection portion 603 includes at least one die dielectric layer (not shown) and a plurality of die interconnects (not shown). The plurality of die interconnects may be configured to be electrically coupled to the plurality of transistors 620. The die interconnection portion 603 includes a plurality of pad interconnects 632 and a dielectric layer 630. The plurality of pad interconnects 632 may be configured to be electrically coupled to the plurality of transistors 620 through the plurality of die interconnects (not shown) of the die interconnection portion 603. The dielectric layer 630 may include a passivation layer. Stage 1 may illustrate a state after at least a portion of an integrated device is provided and/or fabricated.

Stage 2 illustrates a state after the at least one interconnect 221 is formed over the plurality of pad interconnects 632, A plating process and a patterning process may be used to form the at least one interconnect 221. The at least one interconnect 221 is coupled to the plurality of pad interconnects 632.

Stage 3 illustrates a state after at least one dielectric layer 220 is formed and patterned. A deposition, a lamination, an exposure, a development and/or an etching process may be used to form and pattern the at least one dielectric layer 220. The at least one dielectric layer 220 may be formed over and around the at least one interconnect 221. The at least one dielectric layer 220 may be formed over the dielectric layer 630. The at least one dielectric layer 220 may include at least one via-hole 1020.

Figure 12B:
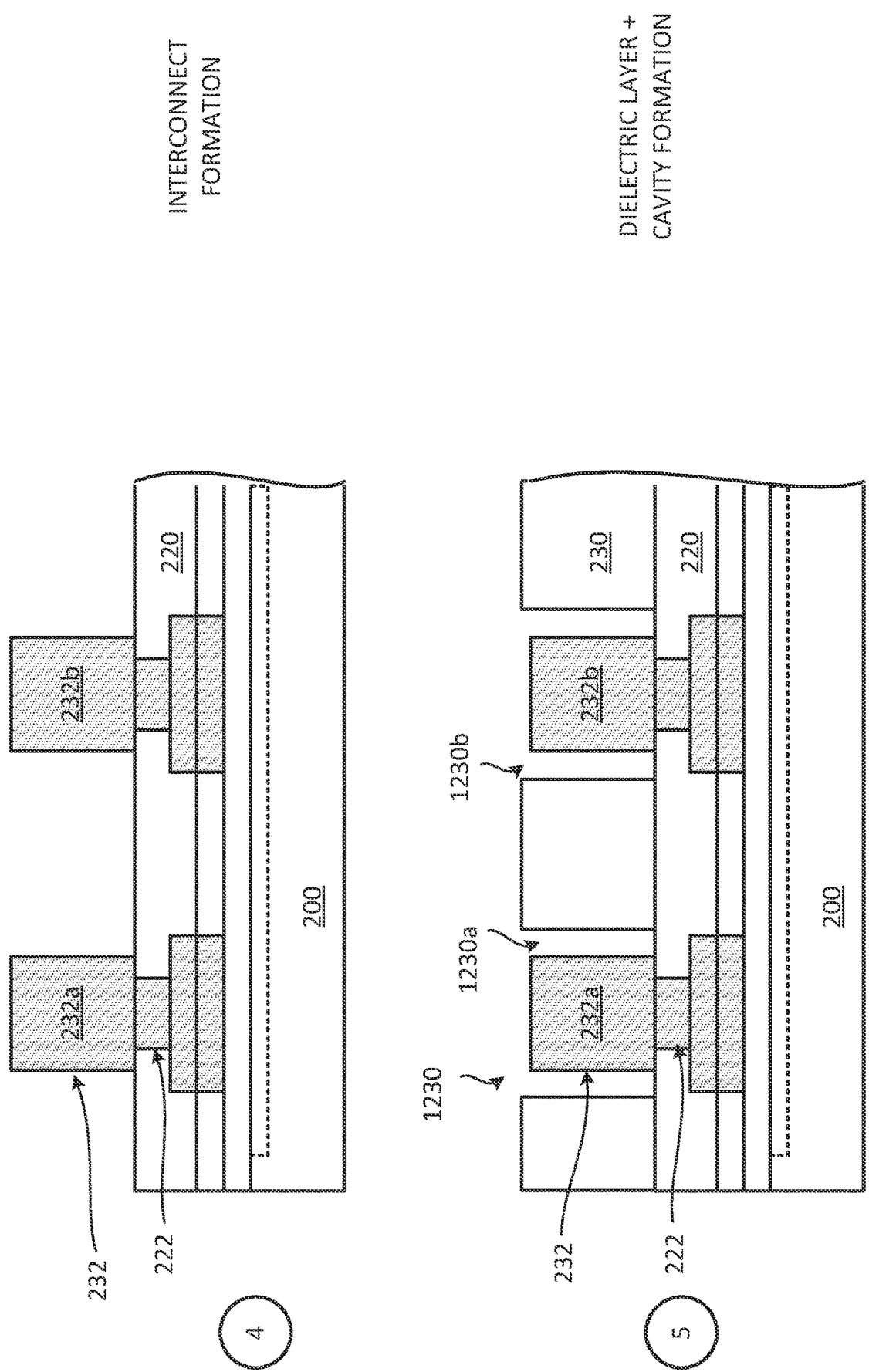

Stage 4, as shown in FIG. 12B, illustrates a state after the at least one interconnect 222 and at least one interconnect 232 are formed. A plating process and a patterning process may be used to form the at least one interconnect 222 and the at least one interconnect 232. Forming the at least one interconnect 222 may include forming via interconnects in the at least one via-hole 1020 of the at least one dielectric layer 220. The at least one interconnect 222 tray be coupled to the at least one interconnect 221 and the at least one interconnect 232. The at least one interconnect 232 include an interconnect 232a and an interconnect 232b. A width of the at least one interconnect 232 may be greater than a width of the at least one interconnect 222.

Stage 5 illustrates a state after at least one dielectric layer 230 is formed and patterned. A deposition, a lamination, an exposure, a development and/or an etching process may be used to form and pattern the at least one dielectric layer 230. The at least one dielectric layer 230 may be formed over and around the at least one interconnect 232. A plurality of cavities 1230 are formed in the at least one dielectric layer 230. The plurality of cavities 1230 includes a cavity 1230a and a cavity 1230b. The cavity 1230a laterally surrounds the interconnect 232a. The cavity 1230b laterally surrounds the interconnect 232b. The cavity 1230a may be formed such that the interconnects 232a is located in the cavity 1230a. The cavity 1230b may be formed such that the interconnects 232b is located in the cavity 1230b.

Figure 12C:
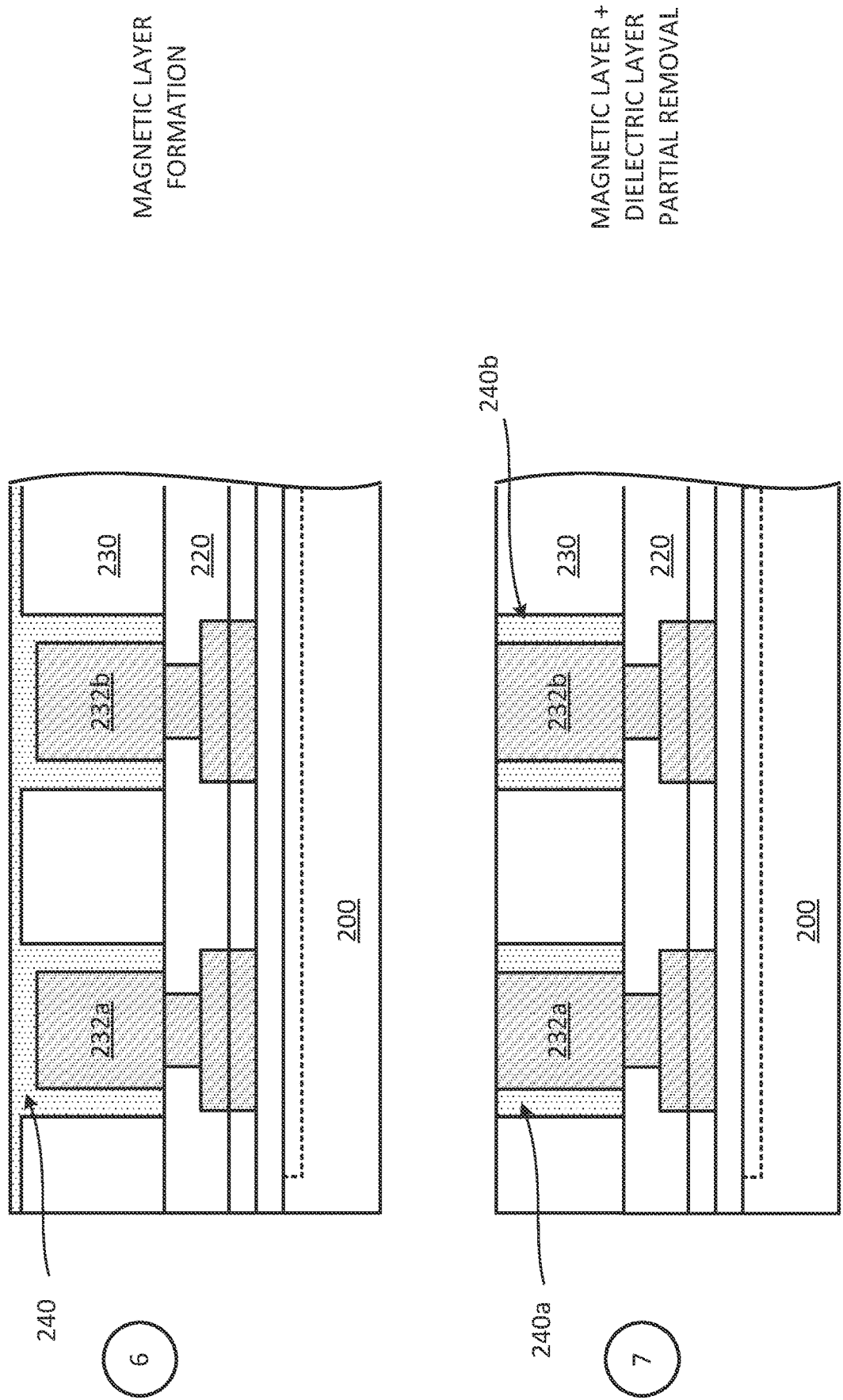

Stage 6, as shown in FIG. 12C, illustrates a state after a magnetic layer 240 is formed over the dielectric layer 220 and the dielectric layer 230. A lamination process may be used to form the magnetic layer 240. A printing process may be used to form paste of the magnetic layer 240 over the dielectric layer 220 and the dielectric layer 230. The magnetic layer 240 may be formed in the plurality of cavities 1230. For example, the magnetic layer 240 may be formed in the cavity 1230a and the cavity 1230b of the dielectric layer 230. The magnetic layer 240 may laterally surround and touch the lateral sides of the interconnect 232a and the lateral sides of the interconnect 232b.

Stage 7 illustrates a state after portions of the magnetic layer 240 and portions of the dielectric layer 230 are removed. A polishing process and/or a grinding process may be used to remove portions of the magnetic layer 240 and portions of the dielectric layer 230. Removing portions of the magnetic layer 240 and portions of the dielectric layer 230 exposes the at least one interconnect 232. It is noted that portions of the at least one interconnect 232 may also be removed through the polishing and/or grinding process.

Figure 12D:
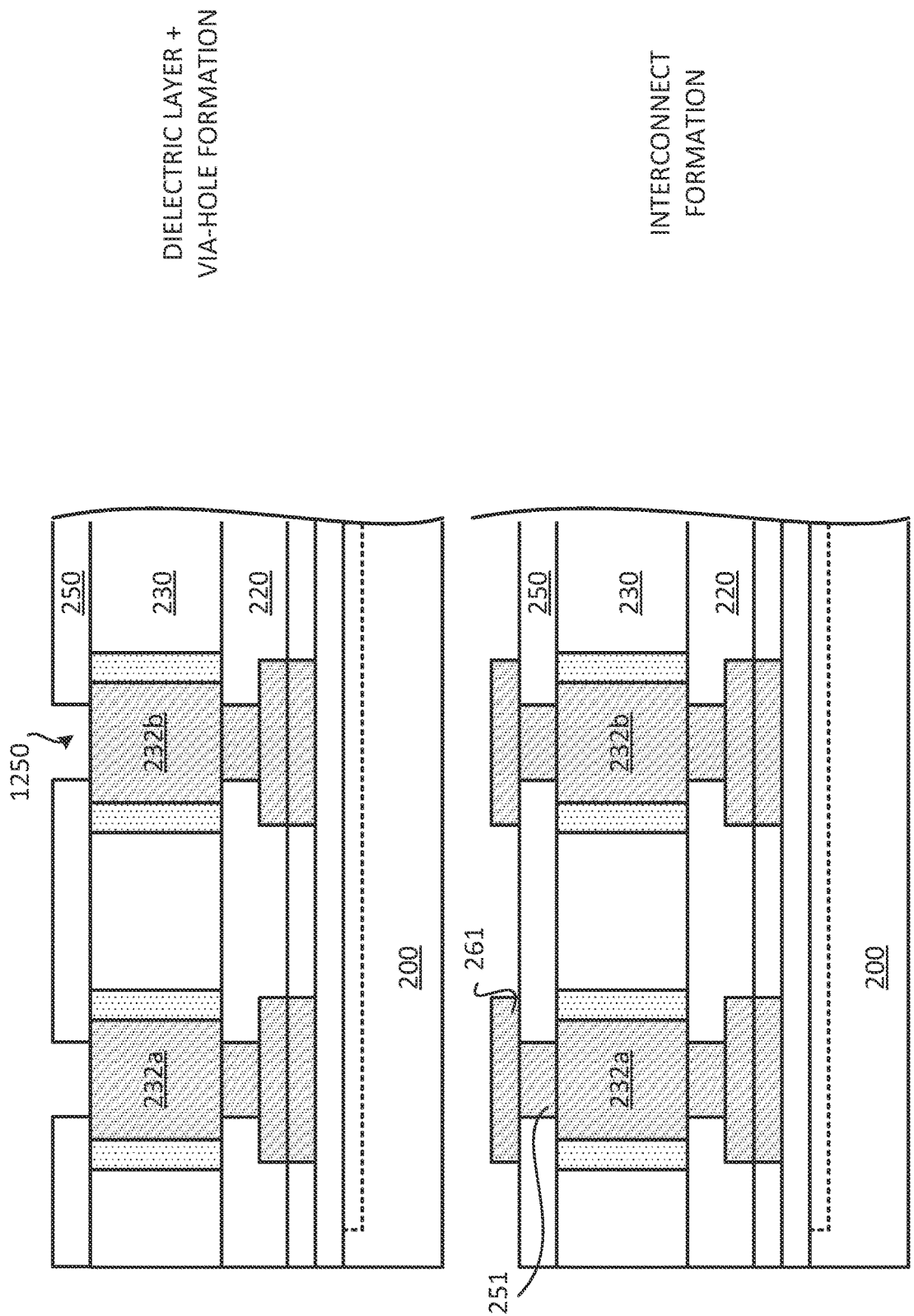

Stage 8, as shown in FIG. 12D, illustrates a state after at least one dielectric layer 250 is formed and patterned. A deposition, a lamination, an exposure, a development and/or an etching process may be used to form and pattern the at least one dielectric layer 250. The at least one dielectric layer 250 may be formed over and around the at least one interconnect 232, the dielectric layer 230 and the magnetic layer 240. The at least one dielectric layer 250 may include at least one via-hole 1250.

Stage 9 illustrates a state after the at least one interconnect 251 and at least one interconnect 261 are formed. A plating process and a patterning process may be used to form the at least one interconnect 251 and the at least one interconnect 261. Forming the at least one interconnect 251 may include forming via interconnects in the at least one via-hole 1250 of the at least one dielectric layer 250. The at least one interconnect 251 may be coupled to the at least one interconnect 232 and the at least one interconnect 261.

Stage 10, as shown in FIG. 12E, illustrates a state after the at least one interconnect 262 is formed. A plating process and a patterning process may be used to form the at least one interconnect 262. The at least one interconnect 262 is formed and coupled to the at least one interconnect 261. The at least one interconnect 262 may include nickel and/or gold.

Stage 11 illustrates a state after at least one dielectric layer 260 is formed and patterned. A deposition, a lamination, an exposure, a development and/or an etching process may be used to form and pattern the at least one dielectric layer 260. The at least one dielectric layer 260 may include at least one opening 1260, which is configured as an opening in the dielectric layer 260 and exposes the interconnect 261 and/or the interconnect 262. A solder interconnect may be configured to be coupled to the interconnect 262 and/or the interconnect 261 through the opening in the dielectric layer 260.

Figure 13:
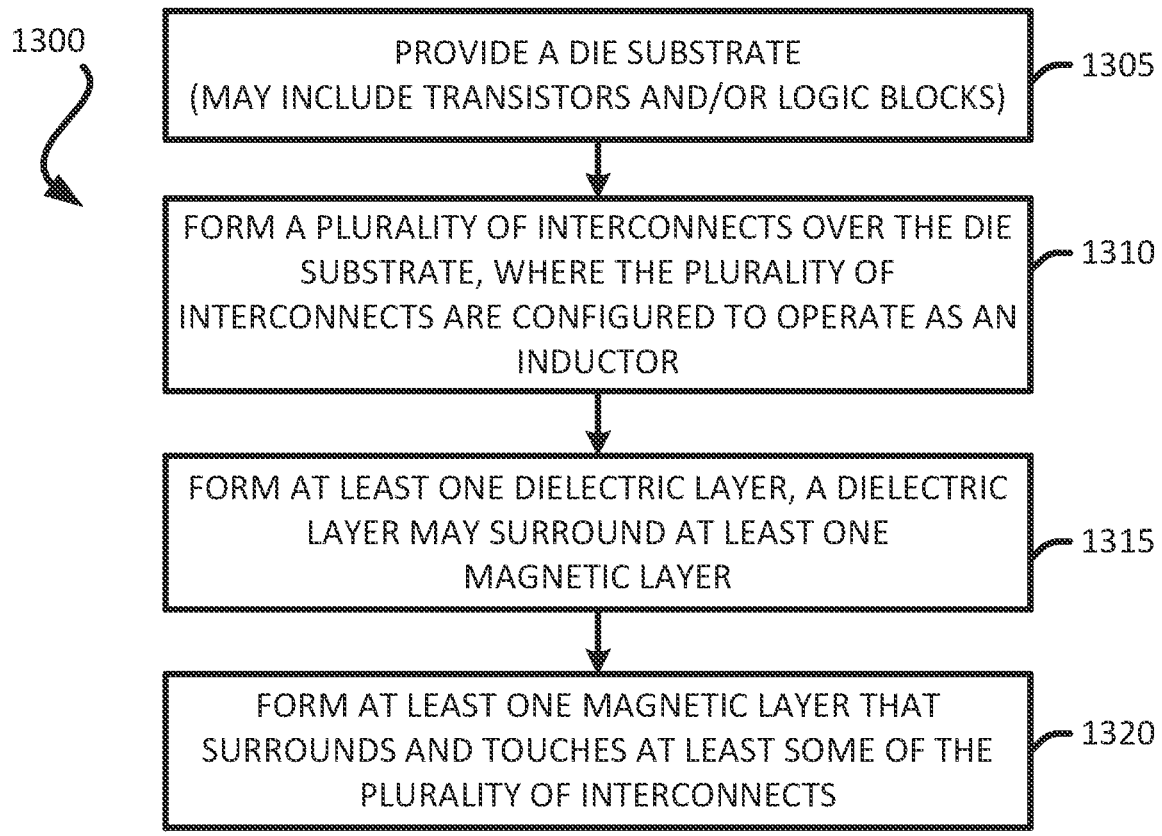
FIG. 13 illustrates an exemplary flow diagram of a method for fabricating an integrated device that includes a magnetic material that surrounds interconnects.

As mentioned above, the above sequence may be performed on a wafer (e.g., silicon wafer) such that several integrated devices are formed at the same time, and the wafer is then singulated to form individual integrated devices comprising a magnetic layer. The above sequence may be fabricated in one facility or at several facilities. For example, when a wafer includes an active portion and an interconnection portion, a portion that includes the magnetic layer may be fabricated over the interconnection portion. The wafer comprising the active portion, the interconnection portion and the magnetic layer may lie singulated to form several integrated devices, Exemplary Flow Diagram of a Method for Fabricating an Integrated Device Comprising Magnetic Layer In some implementations, fabricating an integrated device includes several processes. FIG. 13 illustrates an exemplary flow diagram of a method 1300 for providing or fabricating an integrated device that includes at least one magnetic layer. In some implementations, the method 1300 of FIG. 13 may be used to provide or fabricate the integrated device 103 and/or the integrated device 601. The method 1300 may be implemented on a wafer (e.g., silicon wafer) and then singulated into several integrated devices.

It should be noted that the method 1300 of FIG. 11 may combine one or more processes in order to simplify and/or clarify the method for providing or fabricating an integrated device. In some implementations, the order of the processes may be changed or modified. Moreover, the method 1300 of FIG. 13 may be implemented to provide or fabricate an integrated passive device (e.g., 105, 701) with at least one magnetic layer.

The method provides (at 1105) a die substrate (e.g., 200). The die substrate 200 may include silicon (Si). The die substrate 200 may include a wafer (e.g., silicon wafer). A dielectric layer may be formed and/or located over the die substrate 200. A plurality of transistors 620 may be formed in and/or over the die substrate 200. A plurality of logic blocks may be formed and/or defined by the plurality of transistors 620. The die substrate 200 may be part of an integrated device that includes the die substrate 200, an active portion 602 and a die interconnection portion 603. When fabricating an integrated passive device, the die substrate 200 may be free of the plurality of transistors (e.g., free of active devices). Stage 1 of FIG. 12A, illustrates and describes an example of providing a die substrate. In some implementations, providing the die substrate may include provide at least a portion of an integrated device.

The method forms (at 1310) a plurality of interconnects (e.g., 202) over the die substrate, where at least some of the interconnects from the plurality of interconnects (e.g. 202) are configured to operate as an inductor. A plating process and a patterning process may be used to form the at least one interconnect 202. The plurality of interconnects 202 may include the plurality of interconnects 232. The plurality of interconnects may be formed in and/or over at least one dielectric layer.

The method forms and patterns (at 1315) at least one dielectric layer (e.g., 220, 230, 250, 260). The at least one dielectric layer 230 may laterally surround and touch at least some of the interconnect from a plurality of interconnects 232. A deposition, a lamination, an exposure, a development and/or an etching process may be used to form and pattern the at least one die dielectric layer (e.g., 220, 230, 250, 260). It is noted that forming the plurality of interconnects and the at least one dielectric layer may be performed iteratively. That is, a dielectric layer may be formed followed by forming a plurality of interconnects, then forming another dielectric layer and then forming another plurality of interconnects. Thus, the method forming (at 1310) the plurality of interconnects and forming (at 1315) at least one dielectric layer may be performed iteratively for as many layers as required. In some implementations, the dielectric layer is formed and then the plurality of interconnects are formed. The dielectric layer may be formed such that a portion of the dielectric layer may laterally surround and touch at least one magnetic layer. Stages 2 of FIG. 12A through Stage 5 of FIG. 12B, and Stages 8 of FIG. 12D through Stage 11 of FIG. 12E, illustrate and describe an example of forming a plurality of interconnects and forming at least one dielectric layer.

The method forms (at 1320) at least one magnetic layer (e.g., 240). A printing process that provide a magnetic layer as paste may be used to provide and form the at least one magnetic layer 240. The magnetic layer 240 is formed such that the magnetic layer 240 laterally surrounds and touches at least some of the lateral sides of some of the interconnects from the plurality of interconnects. The at least one magnetic layer 240 may be formed in between when the plurality of interconnects are formed and when the at least one dielectric layer are formed. For example, the magnetic layer 240 may be formed after at least one dielectric layer is formed and a plurality of interconnects are formed. In some implementations, once the magnetic layer 240 is formed, additional dielectric layers and an additional plurality of interconnects may be formed. Stages 6 and 7 of FIG. 12C, illustrate and describe an example of forming a magnetic layer.

Figure 14:
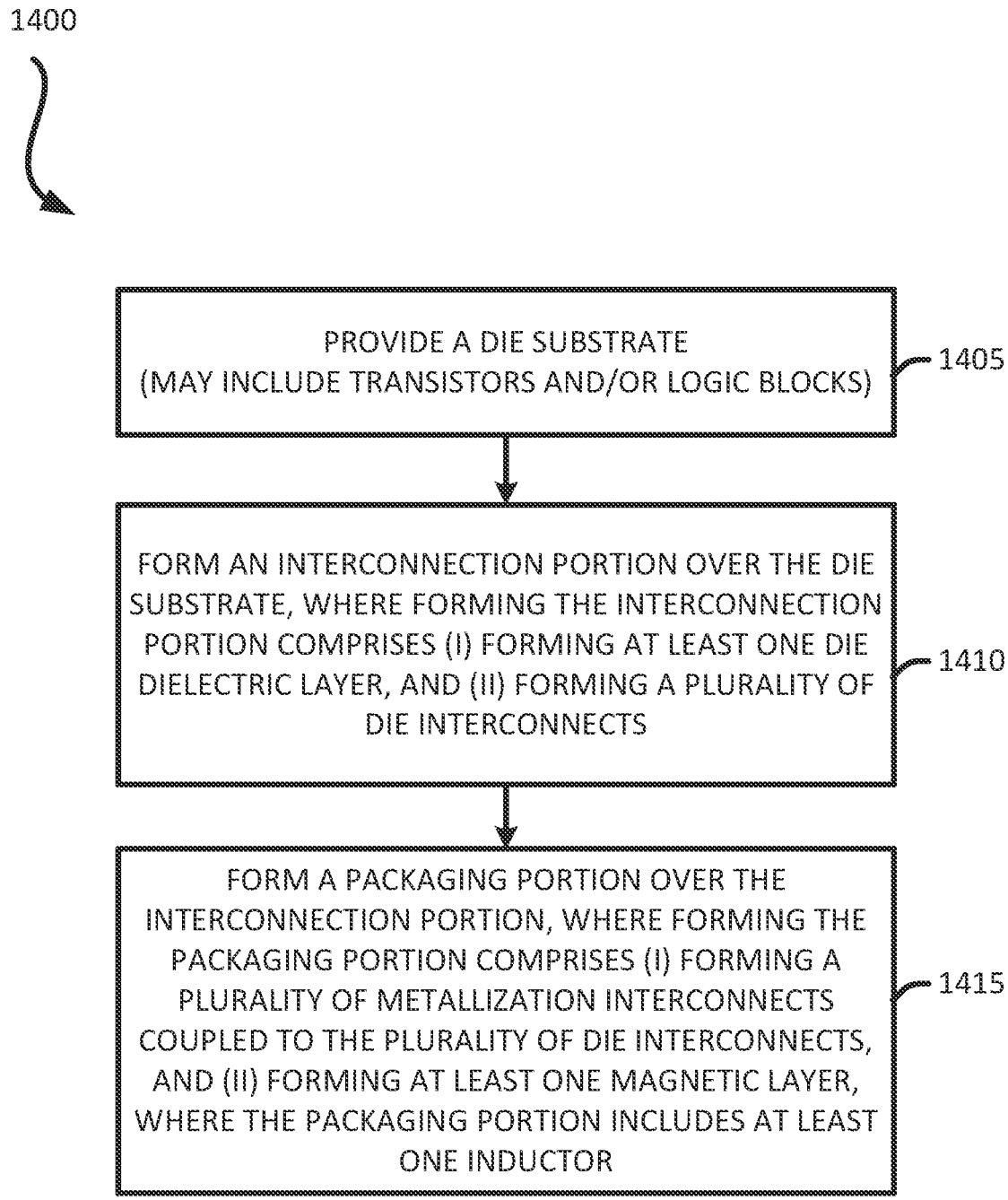
FIG. 14 illustrates another exemplary flow diagram of a method for fabricating an integrated device that includes magnetic material.

Exemplary Flow Diagram of a Method for Fabricating an Integrated Device Comprising Magnetic Layer In some implementations, fabricating an integrated device includes several processes. FIG. 14 illustrates an exemplary flow diagram of a method 1400 for providing or fabricating an integrated device that includes at least one magnetic layer. In some implementations, the method 1400 of FIG. 14 may be used to provide or fabricate the integrated device 103. The method 1400 may be implemented on a wafer (e.g., silicon wafer) and then singulated into several integrated devices.

It should be noted that the method 1400 of FIG. 14 may combine one or more processes in order to simplify and/or clarify the method for providing or fabricating an integrated device. For example, one or more of the processes of the method 1400 may include one or more of the processes of the method 1100 and/or the method 1300. In some implementations, the order of the processes may be changed or modified. Moreover, the method 1400 of FIG. 14 may be implemented to provide or fabricate an integrated passive device (e.g., 105) with at least one magnetic layer.

The method provides (at 1405) a die substrate (e.g., 200). The die substrate 200 may include silicon (Si). The die substrate 200 may include a wafer (e.g., silicon wafer). A plurality of transistors 620 may be formed in and/or over the die substrate 200. A plurality of logic blocks may be formed and/or defined by the plurality of transistors 620. The die substrate 200 may be part of and/or define an active portion (e.g., 602) of an integrated device. When fabricating an integrated passive device, the die substrate 200 may be free of the plurality of transistors (e.g., free of active devices).

The method forms (at 1410) a die interconnection portion (e.g., 603) over the die substrate (e.g., 200), where forming the die interconnection portion 603 includes forming at least one die dielectric layer and forming a plurality of die interconnects. The die interconnection portion 603 may be coupled to the die substrate 200. Forming the die interconnection portion 603 may include forming at least one die dielectric layer and forming and patterning at least one die interconnect.

The method forms (at 1415) a packaging portion over the die interconnection portion (e.g., 603), where forming the packaging portion includes forming a plurality of interconnects coupled to the plurality of die interconnects, and forming at least one magnetic layer. The packaging portion may be coupled to the die interconnection portion 603.

Forming the packaging portion may include forming and patterning a plurality of interconnects (e.g., 202), forming a magnetic layer (e.g., 240, 240a, 240b) and forming at least one dielectric layer (e.g., 220, 230, 250, 260). The packaging portion may include an inductor that is defined by at least one interconnect from the plurality of interconnects (e.g., 202). The at least one magnetic layer includes an insulating layer, a dielectric layer, and/or a non-electrical conducting material. The at least one magnetic layer has a permeability value (e.g., relative permeability value) that is greater than 1.

In some implementations, the magnetic layer may laterally surround and touch one or more interconnects, and at least one dielectric layer may laterally surround and touch the magnetic layer, in a similar manner as described for the integrated device 601. In some implementations, the at least one dielectric layer may laterally surround and touch one or more interconnects, and the magnetic layer may laterally surround and touch the at least one dielectric layer, in a similar manner as described for the integrated device 701.

The method 1400 may iteratively repeat the process of ( ) forming and patterning interconnects and (ii) forming and grinding a dielectric layer and/or a magnetic layer, for as many layers are required.

As mentioned above, the method 1400 may be performed on a wafer (e.g., silicon wafer) such that several integrated devices are formed at the same time, and the wafer is then singulated to form individual integrated devices comprising a magnetic layer.

Figure 15:
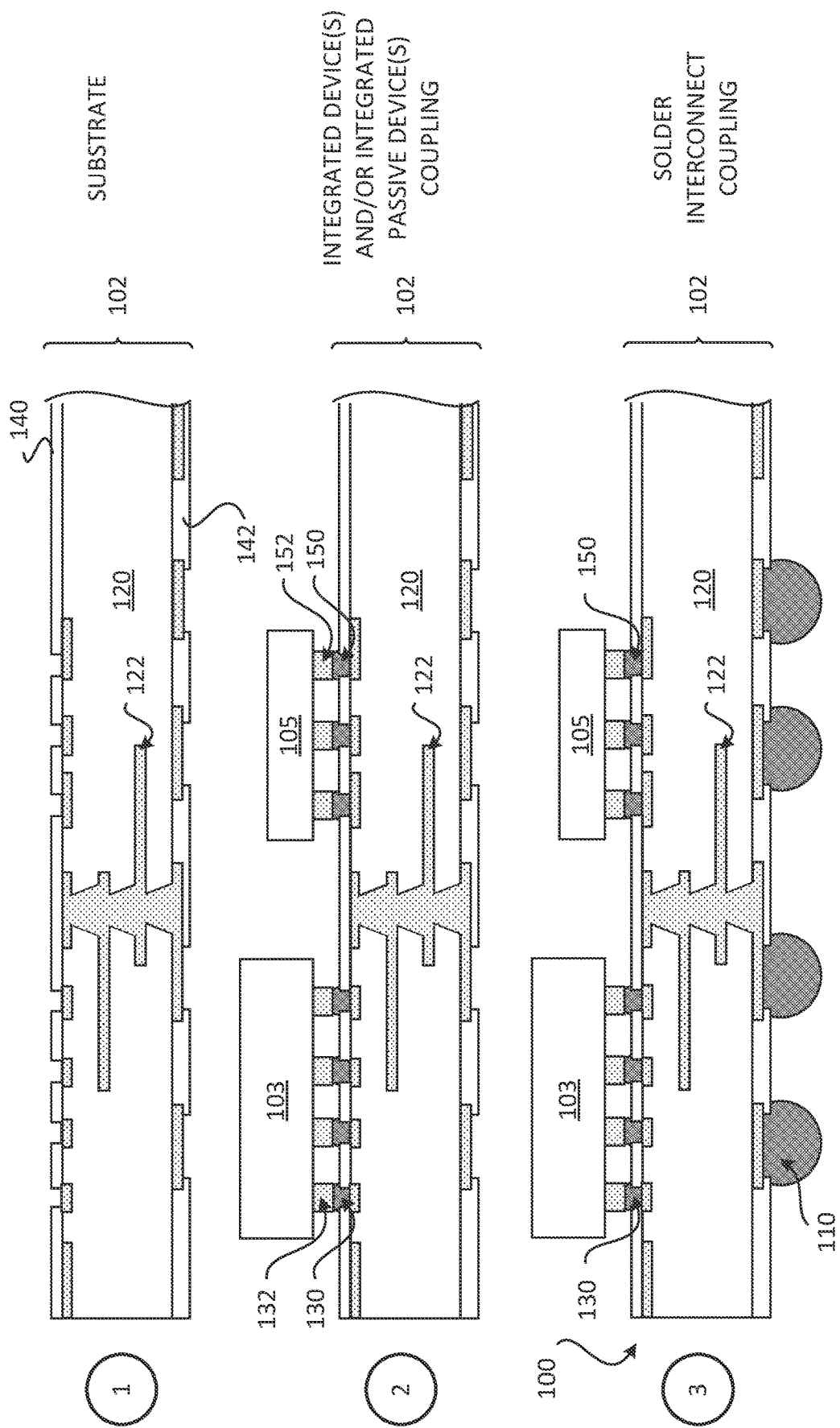
FIG. 15 illustrates an exemplary flow diagram of a method for fabricating a package that includes a substrate, an integrated device and an integrated passive device.

Exemplary Sequence for Fabricating a Package that Includes an Integrated Device and an Integrated Passive Device FIG. 15 illustrates an exemplary sequence for providing or fabricating a package that includes an integrated device comprising a magnetic layer and/or an integrated passive device comprising a magnetic layer. In some implementations, the sequence of FIG. 15 may be used to provide or fabricate the package 100 that includes an integrated device and/or the integrated passive device.

It should be noted that the sequence of FIG. 15 may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIG. 15 may be used to fabricate one package or several packages at a time (as part of a wafer).

Stage 1, as shown in FIG. 15, illustrates a state after the substrate 102 is provided. The substrate 102 may be provided by a supplier or fabricated. The substrate 102 includes at least one dielectric layer 120 and a plurality of interconnects 122, a solder resist layer 140 and a solder resist layer 142. The substrate 102 may include an embedded trace substrate (ET'S). In some implementations, the at least one dielectric layer 120 may include prepreg layer(s).

Stage 2 illustrates a state after the integrated device 103 is coupled to a first surface (e.g., top surface) of the substrate 102. The integrated device 103 may be coupled to the substrate 102 through a plurality of pillar interconnects 132 and a plurality of solder interconnects 130. In some implementations, the plurality of pillar interconnects 132 may be optional. The plurality of solder interconnects 130 are coupled to the plurality of interconnects 122. A solder reflow process may be used to couple the integrated device 103 to the plurality of interconnects 122 through the plurality of solder interconnects 130.

Stage 2 also illustrates a state after the integrated passive device 105 is coupled to the first surface (e.g., top surface) of the substrate 102. The integrated passive device 105 may be coupled to the substrate 102 through a plurality of pillar interconnects 152 and a plurality of solder interconnects 150. In some implementations, the plurality of pillar interconnects 152 may be optional. The plurality of solder interconnects 150 are coupled to the plurality of interconnects 122. A solder reflow process may be used to couple the integrated passive device 105 to the plurality of interconnects 122 through the plurality of solder interconnects 150.

Stage 3 illustrates a state after a plurality of solder interconnects 110 are coupled to the substrate 102. The plurality of solder interconnects 110 may be couple to interconnects that are located over a second surface of the at least one dielectric layer 120. A solder reflow process may be used to couple the plurality of solder interconnects 110 to the substrate 102. Stage 3 may illustrate the package 100. The packages (e.g., 100) described in the disclosure may be fabricated one at a time or may be fabricated together as part of one or more wafers and then singulated into individual packages.

Exemplary Flow Diagram of a Method for Fabricating a Package that Includes an Integrated Device and an Integrated Passive Device In some implementations, fabricating a package that includes an integrated device comprising a magnetic layer and/or an integrated passive device comprising a magnetic layer, includes several processes. FIG. 16 illustrates an exemplary flow diagram of a method 1600 for providing or fabricating package that includes an integrated device comprising a magnetic layer and/or an integrated passive device comprising a magnetic layer. In some implementations, the method 1600 of FIG. 16 may be used to provide or fabricate the package 100 of FIG. 1 described in the disclosure. However, the method 1600 may be used to provide or fabricate any of the packages described in the disclosure.

It should be noted that the method of FIG. 16 may combine one or more processes in order to simplify and/or clarify the method for providing or fabricating a package that includes an integrated device comprising a magnetic layer and/or an integrated passive device comprising a magnetic layer. In some implementations, the order of the processes may be changed or modified.

The method provides (at 1605) a substrate (e.g., 102). The substrate 102 may be provided by a supplier or fabricated. The substrate 102 includes at least one dielectric layer 120, and a plurality of interconnects 122. The substrate 102 may include an embedded trace substrate (ETS). In some implementations, the at least one dielectric layer 120 may include prepreg layers. Stage 1 of FIG. 15 illustrates and describes an example of providing a substrate with escape interconnects.

The method couples (at 1610) at least one integrated device (e.g., 103) to the first surface of the substrate (e.g., 102). For example, the integrated device 103 may be coupled to the substrate 102 through the plurality of pillar interconnects 132 and the plurality of solder interconnects 130. The plurality of pillar interconnects 132 may be optional. The plurality of solder interconnects 130 are coupled to the plurality of interconnects 122. A solder reflow process may be used to couple the integrated device 103 to the plurality of interconnects through the plurality of solder interconnects 130.

The method also couples (at 1610) at least one integrated passive device (e.g., 105) to the first surface of the substrate (e.g., 102). For example, the integrated passive device 105 may be coupled to the substrate 102 through the plurality of pillar interconnects 152 and the plurality of solder interconnects 150. The plurality of pillar interconnects 152 may be optional. The plurality of solder interconnects 150 are coupled to the plurality of interconnects 122. A solder reflow process may be used to couple the integrated passive device 105 to the plurality of interconnects through the plurality of solder interconnects 150. Stage 2 of FIG. 15 illustrates and describes an example of an integrated device and an integrated passive device coupled to a substrate.

The method couples (at 1615) a plurality of solder interconnects (e.g., 110) to the second surface of the substrate (e.g., 102). A solder reflow process may be used to couple the plurality of solder interconnects 110 to the substrate. Stage 3 of FIG. 15 illustrates and describes an example of coupling solder interconnects to the substrate.

Exemplary Electronic Devices

Figure 17:
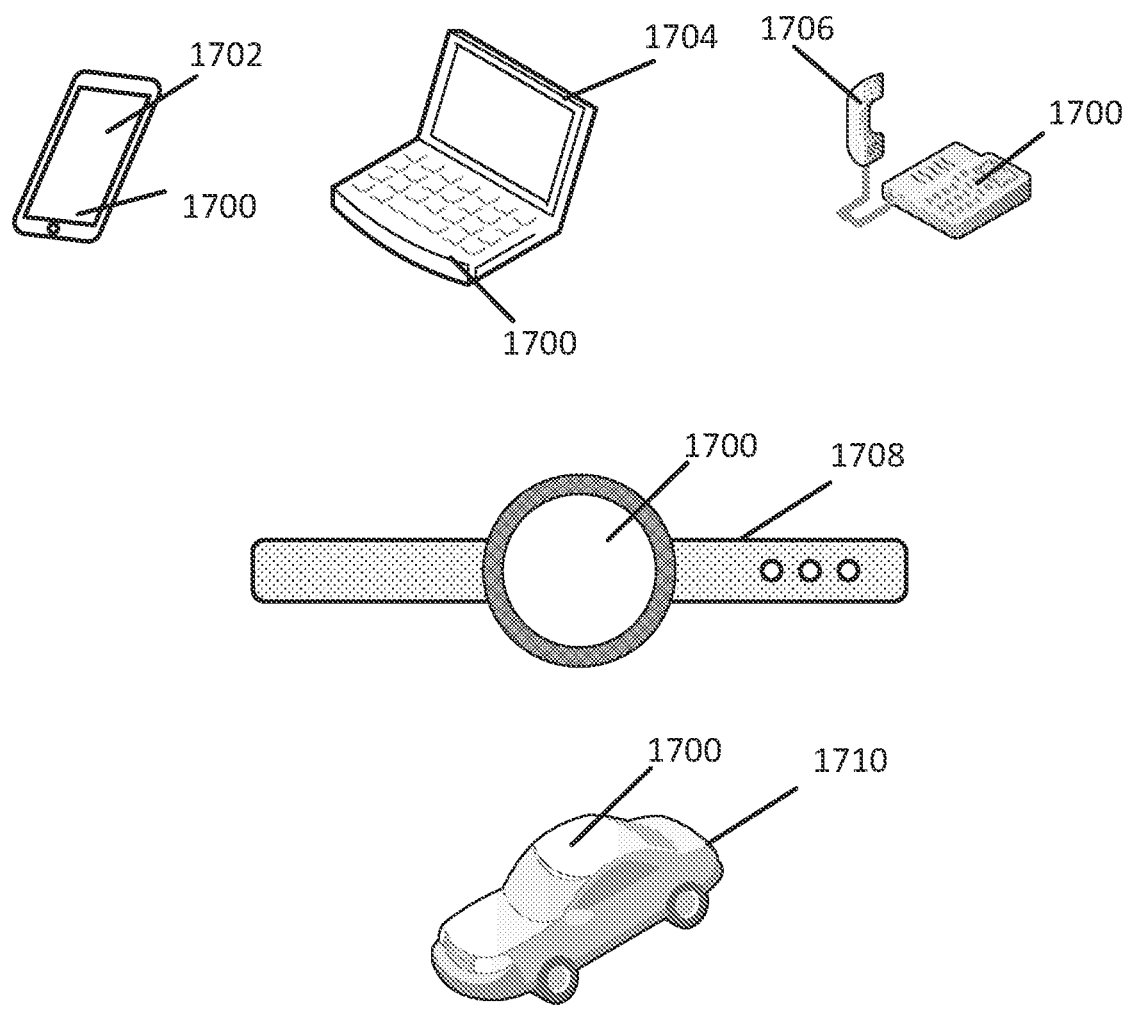
FIG. 17 illustrates various electronic devices that may integrate a die, an electronic circuit, an integrated device, an integrated passive device (IPD), a passive component, a package, and/or a device package described herein.

FIG. 17 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1702, a laptop computer device 1704, a fixed location terminal device 1706, a wearable device 1708, or automotive vehicle 1710 may include a device 1700 as described herein. The device 1700 may be, for example, any of the devices and/or integrated circuit (IC) packages described herein. The devices 1702, 1704, 1706 and 1708 and the vehicle 1710 illustrated in FIG. 17 are merely exemplary. Other electronic devices may also feature the device 1700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-9, 10A-10E, 11, 12A-12E and/or 13-17 may be rearranged and/or combined into a single component, process, feature or function or embodied in several components, processes, or functions. Additional elements, components, processes, and/or functions may also be added without departing from the disclosure. It should also be noted FIGS. 1-9, 10A-10E, 11, 12A-12E and/or 13-17 and its corresponding description in the present disclosure is not limited to dies and/or ICs. In some implementations, FIGS. 1-9, 10A-10E, 11, 12A-12E and/or 13-17 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect: 1: A device comprising a die substrate, a plurality of interconnects located over the die substrate, wherein the plurality of interconnects are configured to operate as an inductor, at least one magnetic layer that surrounds at least part of the plurality of interconnects and at least one dielectric layer that surrounds the at least one magnetic layer.

Aspect: 2: The device of aspect 1, wherein the plurality of interconnects comprises a first via interconnect and a second via interconnect, and wherein the at least one magnetic layer comprises a first magnetic layer that laterally surrounds and touches the first via interconnect, and a second magnetic layer that laterally surrounds and touches the second via interconnect.

Aspect: 3: The device of aspect 2, wherein the at least one dielectric layer laterally surrounds the first magnetic layer and the second magnetic layer.

Aspect: 4: The device of aspects 2 through 3, wherein the first via interconnect is planar to the second via interconnect.

Aspect: 5: The device of aspects 1 through 4, wherein the at least one dielectric layer surrounds and touches at least part of the plurality of interconnects.

Aspect: 6: The device of aspects 1 through 5, further comprising a plurality of transistors located in the die substrate.

Aspect: 7: The device of aspects 1 through 6, wherein the at least one magnetic layer includes an insulating layer and/or a dielectric layer.

Aspect: 8: The device of aspects 1 through 7, wherein the at least one magnetic layer includes a non-electrical conducting material.

Aspect: 9: The device of aspects 1 through 8, wherein the at least one magnetic layer has a relative permeability value that is greater than 1.

Aspect: 10: The device of aspects 1 through 9, wherein the at least one magnetic layer has a magnetic loss tangent value that is in a range of 0.01-0.04 for frequencies up to 100 MHz.

Aspect: 11: A device comprising a die substrate, a plurality of interconnects located over the die substrate, wherein the plurality of interconnects are configured to operate as an inductor, at least one dielectric layer that surrounds at least part of the plurality of interconnects and at least one magnetic layer that surrounds the at least one dielectric layer.

Aspect: 12: The device of aspect 11, wherein the plurality of interconnects comprises a first via interconnect and a second via interconnect, and wherein the at least one dielectric layer comprises a first dielectric layer that laterally surrounds and touches the first via interconnect, and a second dielectric layer that laterally surrounds and touches the second via interconnect.

Aspect: 13: The device of aspect 12, wherein the at least one magnetic layer laterally surrounds and touches the first dielectric layer and the second dielectric layer.

Aspect: 14: The device of aspects 12 through 13, wherein the first via interconnect is planar to the second via interconnect.

Aspect: 15: The device of aspects 11 through 14, wherein the at least one dielectric layer touches at least part of the plurality of interconnects.

Aspect: 16: The device of aspects 11 through 15, further comprising a plurality of transistors located in the die substrate.

Aspect: 17: The device of aspects 11 through 16, wherein the at least one magnetic layer includes an insulating layer and/or a dielectric layer.

Aspect: 18: The device of aspects 11 through 17, wherein the at least one magnetic layer includes a non-electrical conducting material.

Aspect: 19: The device of aspects 11 through 18, wherein the at least one magnetic layer has a relative permeability value that is greater than 1.

Aspect: 20: The device of aspects 11 through 19, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect: 21: A method comprising providing a die substrate. The method forms a plurality of interconnects located over the die substrate, wherein the plurality of interconnects are configured to operate as an inductor. The method forms at least one magnetic layer that surrounds at least part of the plurality of interconnects. The method forms at least one dielectric layer that surrounds the at least one magnetic layer.

Aspect: 22: The method of aspect 21, wherein the plurality of interconnects comprises a first via interconnect and a second via interconnect, and wherein the at least one magnetic layer comprises a first magnetic layer that laterally surrounds and touches the first via interconnect, and a second magnetic layer that laterally surrounds and touches the second via interconnect.

Aspect: 23: The method of aspect 22, wherein the at least one dielectric layer laterally surrounds the first magnetic layer and the second magnetic layer.

Aspect: 24: The method of aspects 21 through 23, wherein the die substrate comprises a plurality of transistors.

Aspect: 25: The method of aspects 21 through 24, wherein the at least one magnetic layer includes an insulating layer, a dielectric layer, and/or a non-electrical conducting material, and wherein the at least one magnetic layer has a relative permeability value that is greater than 1.

Aspect: 26: A method comprising providing a die substrate. The method forms a plurality of interconnects located over the die substrate, wherein the plurality of interconnects are configured to operate as an inductor. The method forms at least one dielectric layer that surrounds and touches at least part of the plurality of interconnects. The method forms at least one magnetic layer that surrounds and touches the at least one dielectric layer.

Aspect: 27: The method of aspect 26, wherein the plurality of interconnects comprises a first via interconnect and a second via interconnect, and wherein the at least one dielectric layer comprises a first dielectric layer that laterally surrounds and touches the first via interconnect, and a second dielectric layer that laterally surrounds and touches the second via interconnect.

Aspect: 28: The method of aspect 27, wherein the at least one magnetic layer laterally surrounds and touches the first dielectric layer and the second dielectric layer.

Aspect: 29: The method of aspects 26 through 28, wherein the die substrate comprises a plurality of transistors.

Aspect: 30: The method of aspects 26 through 29, wherein the at least one magnetic layer includes an insulating layer, a dielectric layer, and/or a non-electrical conducting material, and wherein the at least one magnetic layer has a relative permeability value that is greater than 1.

The various features of the disclosure described herein can be implemented in different systems without departing front the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:
a die substrate;
a plurality of interconnects located over the die substrate, wherein the plurality of interconnects are configured to operate as an inductor and wherein the plurality of interconnects comprises a first via interconnect and a second via interconnect;
at least one dielectric layer that surrounds at least part of the plurality of interconnects, wherein the at least one dielectric layer comprises a first dielectric layer that laterally surrounds and touches the first via interconnect, and a second dielectric layer that laterally surrounds and touches the second via interconnect; and at least one magnetic layer that surrounds the at least one dielectric layer, wherein the at least one magnetic layer laterally surrounds and touches the first dielectric layer and the second dielectric layer.

2. The device of claim 1, wherein the first via interconnect is planar to the second via interconnect.

3. The device of claim 1, further comprising a plurality of transistors located in the die substrate.

4. The device of claim 1, wherein the at least one magnetic layer includes an insulating layer and/or a dielectric layer.

5. The device of claim 1, wherein the at least one magnetic layer includes a non-electrical conducting material.

6. The device of claim 1, wherein the at least one magnetic layer has a relative permeability value that is greater than 1.

7. The device of claim 1, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

8. A method comprising:
providing a die substrate;
forming a plurality of interconnects located over the die substrate, wherein the plurality of interconnects are configured to operate as an inductor, and wherein the plurality of interconnects comprises a first via interconnect and a second via interconnect;
forming at least one dielectric layer that surrounds and touches at least part of the plurality of interconnects, wherein the at least one dielectric layer comprises a first dielectric layer that laterally surrounds and touches the first via interconnect, and a second dielectric layer that laterally surrounds and touches the second via interconnect; and
forming at least one magnetic layer that surrounds and touches the at least one dielectric layer, and wherein the at least one magnetic layer laterally surrounds and touches the first dielectric layer and the second dielectric layer.

9. The method of claim 8, wherein the die substrate comprises a plurality of transistors.

10. The method of claim 8,
wherein the at least one magnetic layer includes an insulating layer, a dielectric layer, and/or a non-electrical conducting material, and
wherein the at least one magnetic layer has a relative permeability value that is greater than 1.

* * * * *